United States Patent [19]
Amberg et al.

[11] Patent Number: 5,897,400
[45] Date of Patent: Apr. 27, 1999

[54] TOWER BUILDING BLOCK SYSTEM

[75] Inventors: Mark Frederick Amberg, Littleton; Theodore Ernst Bruning, III; Benjamin Alma Young, both of Colorado Springs, all of Colo.

[73] Assignee: Digital Equipment Corporation, Houston, Tex.

[21] Appl. No.: 08/884,986

[22] Filed: Jun. 30, 1997

[51] Int. Cl.⁶ .................................................. H01R 9/22
[52] U.S. Cl. ........................ 439/717; 439/347; 439/928
[58] Field of Search ................................. 361/728–732, 361/735; 439/347, 717, 928, 310, 345, 372

[56] References Cited

U.S. PATENT DOCUMENTS

| | | | |
|---|---|---|---|
| 4,558,914 | 12/1985 | Prager et al. | 439/347 X |
| 4,591,228 | 5/1986 | Vasseur | 439/717 X |
| 5,192,222 | 3/1993 | Krause et al. | 439/347 |
| 5,421,739 | 6/1995 | Provenzale | 439/347 |

*Primary Examiner*—Khiem Nguyen
*Attorney, Agent, or Firm*—Hamilton, Brook, Smith & Reynolds, P.C.

[57] ABSTRACT

Racks of modules especially useful for retaining disk drives, tape drives, controllers, computers and the like are fabricated via use of tower building blocks. Each block contains a latch arrangement for securing it to another block, a base unit or a cap unit with the latch effecting interlocking of the blocks so as to form a sturdy assembled structure. Power and/or electrical communication lines are provided in each block with power passing through one vertical array of blocks and electrical communications passing through the other so as to reduce the need for shielding one from the other. An arrangement of alignment pins and mating receptacle holes in conjunction with selected placement of sliding latch elements can facilitate proper coupling of blocks which have similar electrical path boards therein.

16 Claims, 23 Drawing Sheets

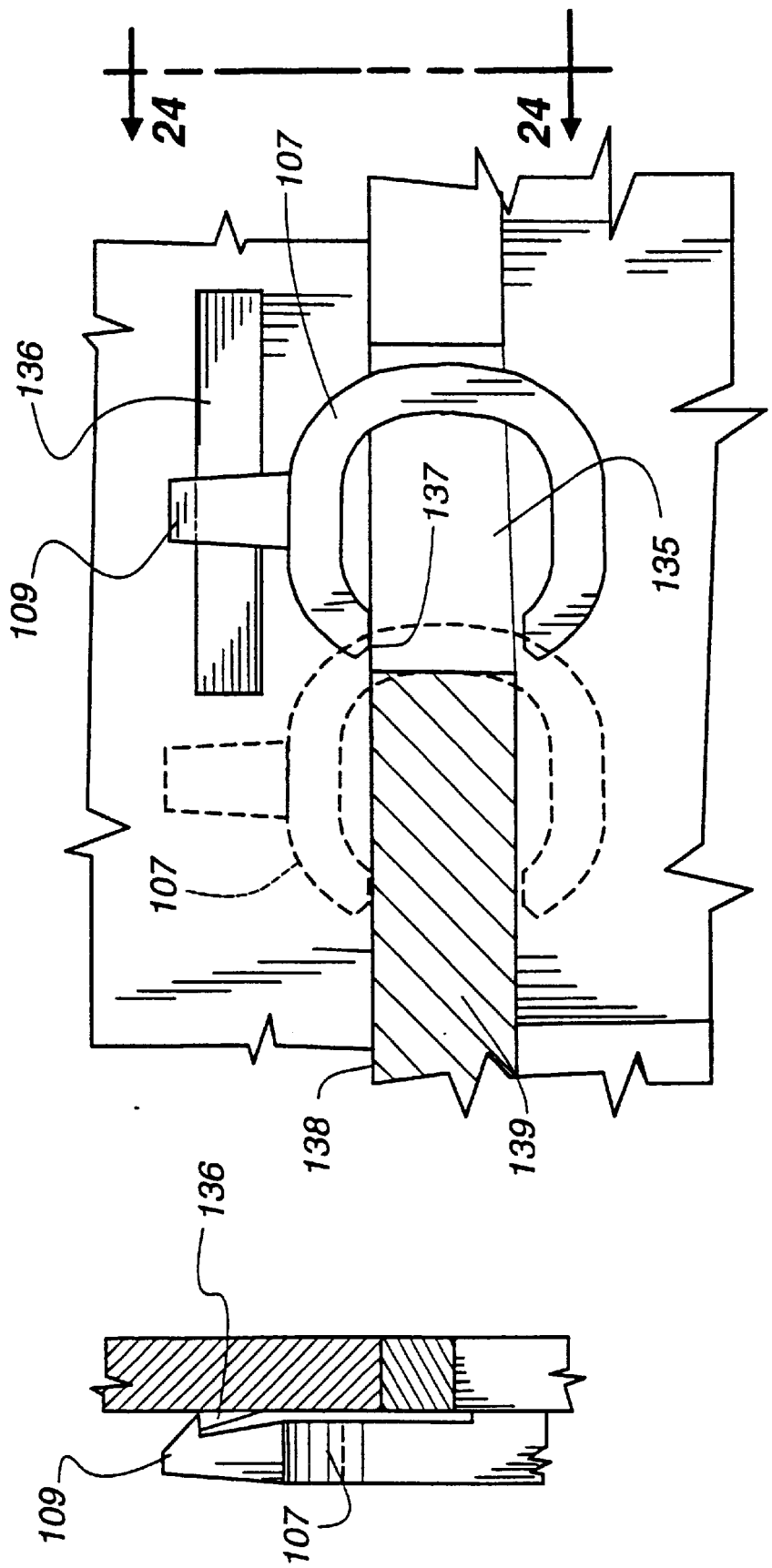

TOWER BUILDING BLOCK SYSTEM

CROSS REFERENCE TO RELATED APPLICATIONS

The following copending, concurrently filed, and commonly-assigned patent applications describe electrical path configurations useful in a tower building block system for storing computing system devices in accordance with this invention. The below applications are hereby incorporated by reference.

1. "Power Bus System" by Mark Amberg et al, U.S. patent application Ser. No. 08/884,938 filed Jun. 30, 1997.

2. "Input/Output Bus System In A Tower Building Block System" by Mark Amberg et al, U.S. patent application Ser. No. 08/884,777 filed Jun. 30, 1997.

BACKGROUND OF THE INVENTION

FIELD OF THE INVENTION

This invention relates to structure and processes for retaining electronic modules and components in physical and operative interrelationship to each other. More particularly, the present invention is concerned with apparatus and methods for stacking and interconnecting a multiplicity of electronic units in a mechanically and electrically interconnected relationship. Columnar racks of electronic equipment are established through use of the present invention.

DESCRIPTION OF THE RELATED ART

It is known in the art to form racks of modules of electronic equipment by creating an overall frame into which the modules are inserted. See for instance U.S. Pat. Nos. 5,291,838 by Ferchau et al and 5,298,681 by Swift et al. Electrical interconnections between the mounted modules are generally provided by a maze of external cabling, by cabling which passes through or along the tubular members forming the frame, or by special coupler adapters such as those shown in U.S. Pat. No. 4,950,178 by Harvey et al and in U.S. Pat. No. 5,466,172 by Carstens et al.

The use of rack frames limits the number of modules or elements in a given stack or else requires acceptance of greater space requirements if less than all the shelves of the frame are in use. Thus, others have endeavored to avoid use of discrete frames by adapting the elements for stacking by providing arrangements for retaining elements on top of each other. For example, U.S. Pat. No. 5,515,239 by Kamerman et al shows L-shaped shelf elements that are held in stacked relation between base and cap units by means of pivotal T-shaped connectors while cables electrically interconnect the elements through the use of D-type connectors. Another example of prior efforts to produce equipment racks by interlocking and stacking individual modules is suggested in U.S. Pat. No. 4,718,858 by Godfrey et al which employs a pivotal handle to both retain modules physically and to engage electrical connectors. U.S. Pat. No. 5,142,445 by Sorensen et al describes stackable modules that are held together by locking pins inserted into attachment feet channels beneath each module.

Despite the state of the prior art, the need persists for arrangements capable of securely retaining stacks of devices with a high degree of flexibility in accepting a relatively wide variety of module shapes and sizes in a rack-like configuration suitable for use or shipping as a unit while accommodating electrical communication and power interconnections between those modules.

SUMMARY OF THE INVENTION

In accordance with the present invention, tower building blocks are advantageously utilized to provide mechanical structure as well as input/output (I/O) bus communication and power routing for a stack of shelves or other rack mountable devices. The invention is cost efficient in that it can utilize existing shelf structures while eliminating many elements inherent in fixed cabinet designs. The modular nature of this invention allows for nearly unlimited expansion opportunities with remarkable versatility.

The tower building blocks of this invention provides a highly flexible enclosure system for a wide family of products including data storage devices such as disk drives, tape drives, controllers, processors and the like. The invention provides a modular enclosure for device storage shelves which do not require additional EMI certification while maintaining all the functionality of contemporary cabinetry. The structure provides excellent structural strength while remaining suitable for fabrication of plastic materials. The invention is a superstructure which routs power and I/O bus distribution for all of the devices contained within the shelf area while permitting relatively straight-forward snap-type assembly.

Whenever a contemporary cabinet enclosure is introduced, independent EMI testing is required. The present invention reduces the need for additional EMI testing for new devices thereby avoiding much of the additional testing costs. Furthermore, the present invention makes it possible for reducing entry level costs to the user who can acquire only the capacity necessary for their utilization while avoiding the necessity for acquisition of a fixed cabinet having greater capacity than is needed, all while enjoying a practically unlimited modular expansion capability as needed or desired at a later time.

Apparatus in accordance with this invention permits the secure stacking of equipment modules between a pair of blocks. These blocks each have first and second elongated panels retained in parallel but spaced relation to one another so as to define elongated channels opening from opposite sides into the space therebetween. A latch element is slidably mounted within one of these elongated channels with that latch element containing a first plurality of finger segments The other of the elongated channels has an arrangement for receiving a similar latch element contained on another block and including a second plurality of finger segments for cooperatively engaging the first plurality of finger segments of the other block.

A mount attached to an exterior surface of one of the panels securely receives the equipment module intended as a component of the stacked storage. A lever is connected for moving the latch element for shifting at least one of the pluralities of finger segments between engaged and disengaged positions.

This apparatus can further include at least one alignment pin extending from one side of one of the panels and at least one alignment pin receptacle on the opposite side of that same panel. A board having electrical connections between opposite edges thereof with electrical couplings from that board to the equipment module secured between the panels is retained in intervening but parallel relation to the block panels. The board also has opposite edge electrical connections accessible in respective channels formed by the panels thereby establishing electrical connections between blocks when the associated latch elements are engaged.

The latch element can include at least one snap for retaining the latch element in the receiving channel whenever the latch element is not engaged within a receiving channel of another block. The operating lever can include an over-center mounting between the panels so as to lock the latch element in place and retain the two thus coupled blocks in interlocked relation. In addition, this lever can have an arm externally extending from the surface of one of the panels.

For interfacing alignment purposes, each panel can include a plurality of pins extending from one side and a matching plurality of receptacles on the other side. Thus, a tower is formed by a plurality of these blocks each having a board retained therein with some of said boards having power connections while others of the boards having electrical signal connections. To prevent inadvertent coupling of a power connector to an electrical signal connector, these panel pins, receptacles and slidable latch elements for blocks having power connections are positioned oppositely from the panel pins, receptacles and slidable latch in the blocks having electrical connection boards retained therein.

The tower can extend from a base unit having a pair of connections along a surface thereof for mechanically securing in spaced relation a respective power connection block and electrical signal connection block. This base unit can include at least one power supply connected for electrically energizing a power connector located in conjunction with the base unit connection for engaging the connector of a power connector board in one of the blocks.

The method of fabricating a rack of equipment modules in accordance with this invention begins by forming blocks from parallel panels so as to define channels located on opposite sides thereof with both of these channels having a plurality of receiving slots therein. A latch element is retained in sliding relation in one of those channels with a plurality of finger segments extending outwardly from that channel. A base unit is constructed having a pair of upwardly facing channels with a first of those channels having a plurality of receiving slots similar to that in the block. The second of these base unit channels has a latch element with a plurality of finger segments slidably retained therein also similar to that of the block.

One of the blocks is secured to the base unit by inserting the finger segments of the block into the base unit receiving slots and sliding the latch element into a locked position. A second of the blocks is secured to the base unit by inserting the finger segments of the latch element of the base unit into the receiving slots of that second block and sliding the latch element into a locked position. An equipment module is then attached between the panels of the two blocks.

An electrical path is established through at least one of the blocks as well as with the equipment module attached thereto. It thus becomes possible to couple this electrical path to an electrical power source. Establishment of a second electrical path in selected blocks can support electrical signal communication between blocks and at least one equipment module attached thereto. It is preferable to provide some form of differentiation between blocks having an electrical path for coupling to the power source and blocks having the electrical path therethrough arranged for supporting electrical signal communication.

One way to provide this differentiation is to arrange mating pins and receptacle holes for allowing mechanical connection only between blocks and base unit connectors having similar electrical paths and appropriately mating connectors. Further, positioning of these mating pins and receptacle holes can facilitate alignment of the blocks relative to one another during attachment.

Those having normal skill in the art will recognize the foregoing and other objects, features, advantages and applications of the present invention from the following more detailed description of the preferred embodiments as illustrated in the accompanying drawings.

BRIEF DESCRIPTION OF THE DRAWINGS

FIG. 23 is a view of a portion of a C-spring in engagement with a ridge of a block panel.

FIG. 24 is a view taken along section line 24—24 of FIG. 23.

DETAILED DESCRIPTION OF THE PREFERRED EMBODIMENTS

Figure 1:
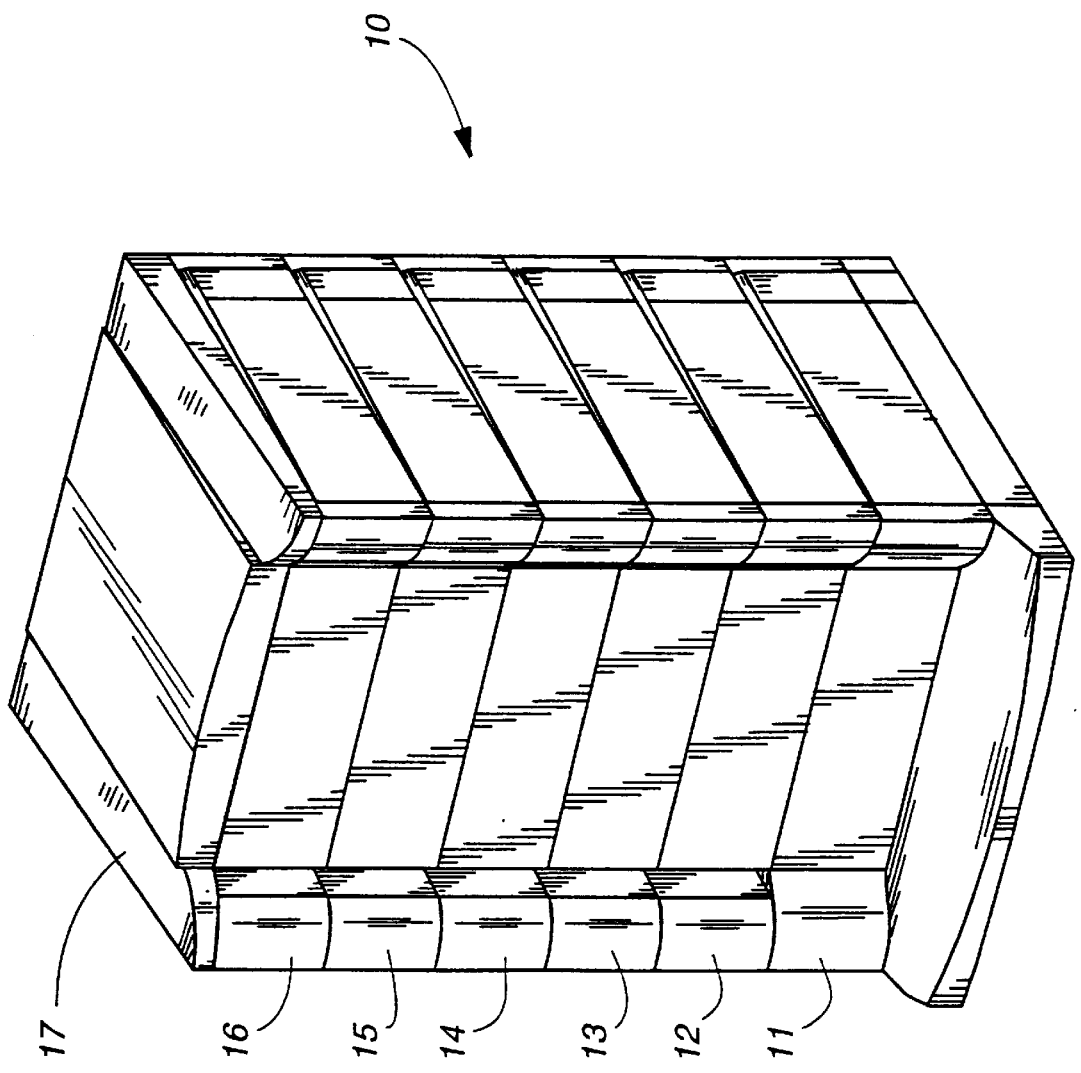
FIG. 1 is an overall isometric view of a tower composed of a base unit and five shelf elements in accordance with this invention.
Figure 2:
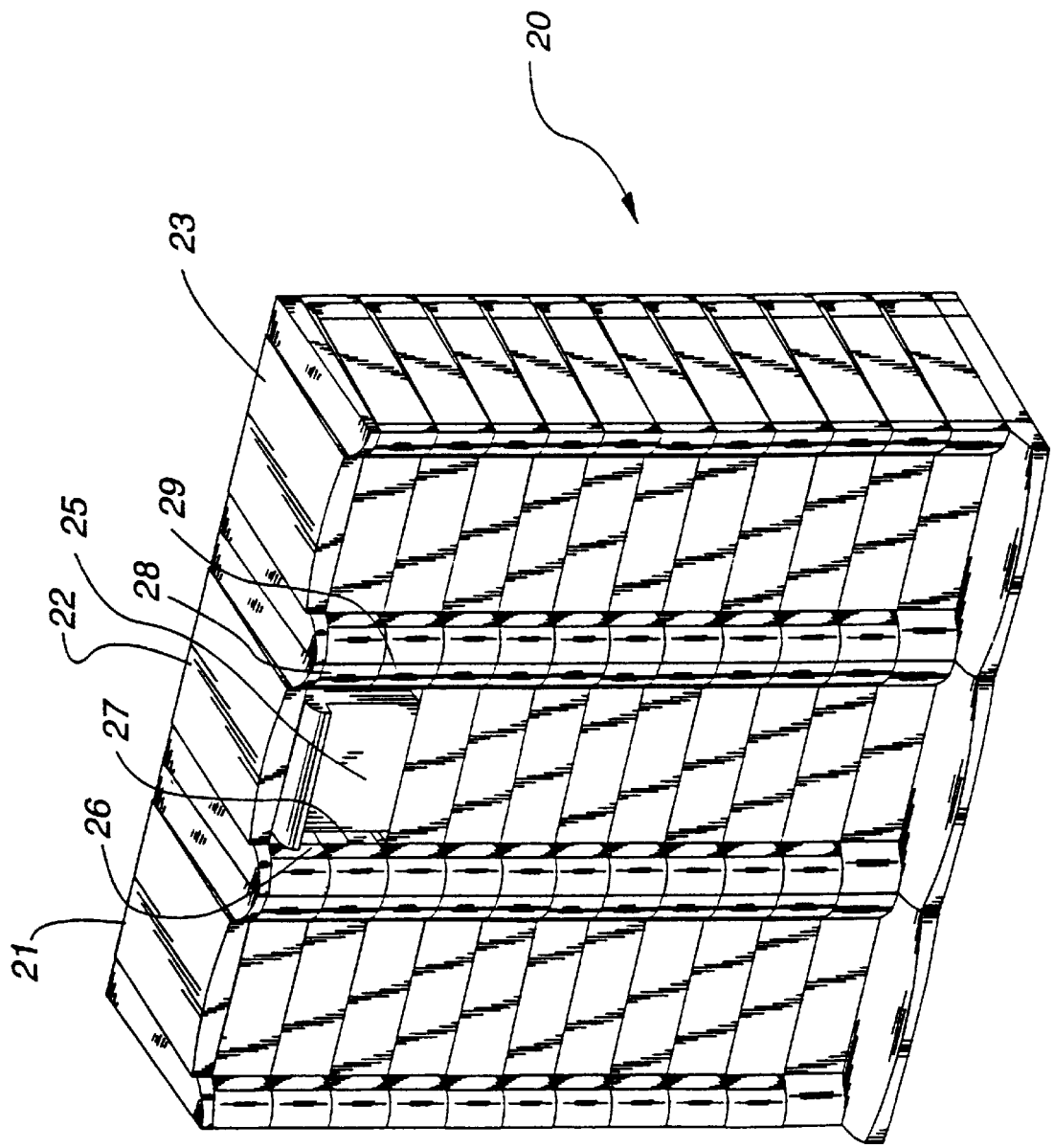
FIG. 2 is an overall isometric view of three towers with ten modules on the two outer towers while the middle tower includes a unit requiring a double shelf spacing.

FIG. 1 shows an assembly 10 of electronic modules composed of a base unit 11, five tower building block units 12–16, and a cap unit 17. Each of these units is covered by a cosmetic panel and the details of their structure hidden by those panels is discussed in greater detail below. Also, as is evident from the description presented below, the assembly 10 could include a greater or lesser number of block units similar to 12–16. For instance, FIG. 2 presents an arrangement 20 of three racks 21, 22 and 23 either free standing or attached to each other. Racks 21 and 23 are composed of ten block units in addition to their base and cap units whereas rack 23 is composed of nine block units plus the base and cap units. There is no limit to the number of block units a rack can contain, although safety requirements might dictate attachment of the base unit to the floor or other physical restraints of the racks.

Cap units 17 and 21–23 typically include latch elements to mate with the blocks of each column and lock them in place relative to one another. However, these caps are not absolutely necessary under all circumstances. For instance, if the electronic module attached between tow block units is adequately secure to provide a cross-bracing function, such separate caps can be omitted although use of connector covers or even cosmetic cover panels on the topmost block pair could complete EMI isolation and/or could prevent fouling of the electrical connectors or the interior of either column of blocks.

Rack 23 includes a double sized block element 25 which is supported by four tower building blocks 26, 27, 28 and 29. Such a procedure allows use of common sized tower building blocks. However, those having normal skill in the art will recognize from the discussion below that single tower building blocks could replace blocks 26 and 27 as well as a single block for 28 and 29 but with those single blocks twice the size of each of blocks 26–29.

Figure 3:
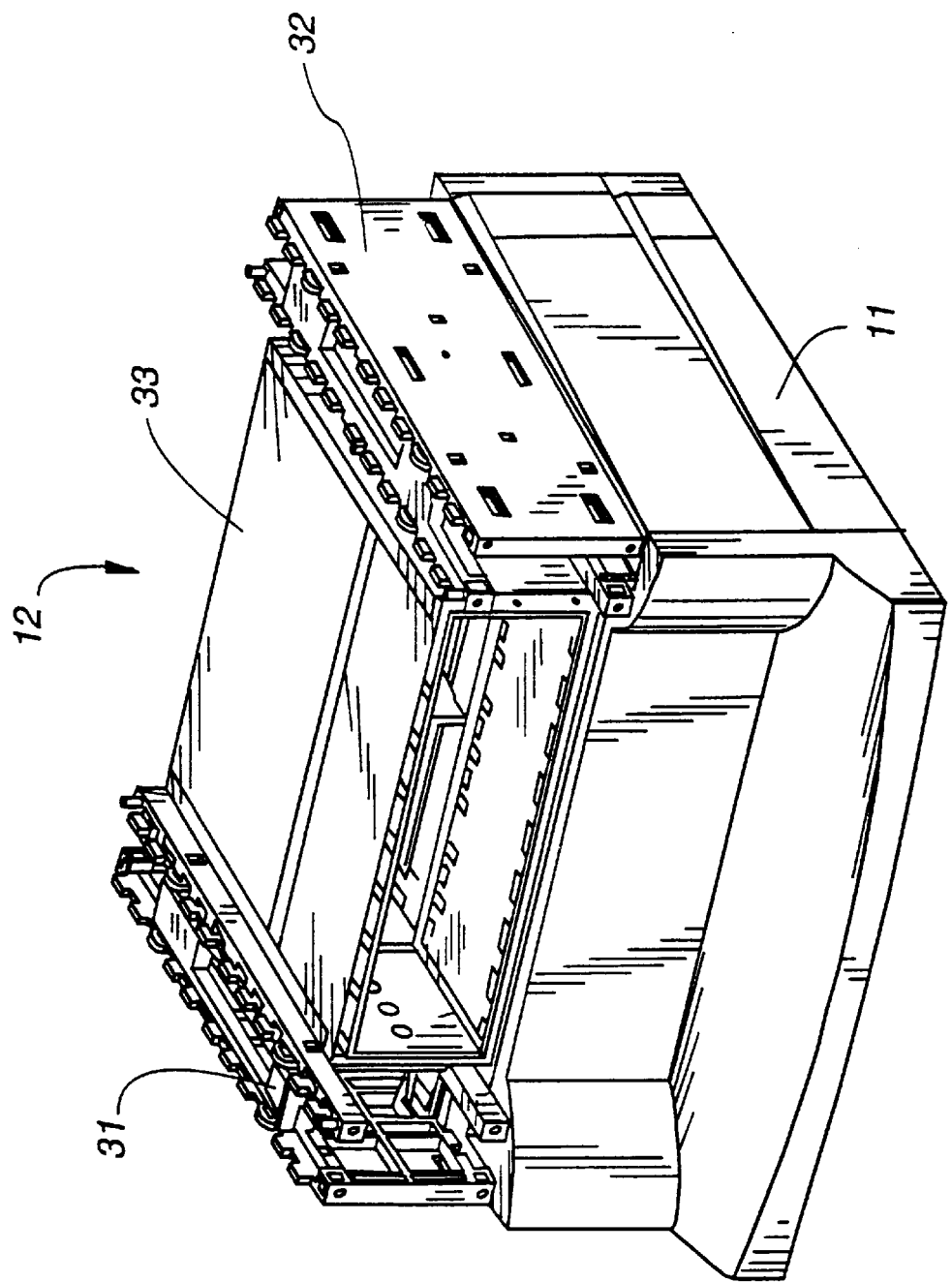
FIG. 3 is an isometric view of a base unit for a tower assembly showing its general relationship to the tower elements and electronics module of the tower segment immediately above the base unit.

FIG. 3 is an isometric view of base unit 11 for the tower assemblies of FIGS. 1 and 2. Tower building block module 12 is shown with its cosmetic covers removed but in its normally attached relation above base unit 11. Module 12 is composed of a left tower building block 31, a right tower building block 32 and an element 33 typically (but not essentially) containing electronic equipment such as one or more disk drives, tape drives, controllers, computers, data communication unit, etc.. As will become apparent, blocks 31 and 32 are firmly attached to base unit 11 while element 33 is both mechanically and electrically coupled to blocks 31 and 32.

Preferably, base unit 11 contains one or more power entry units for powering the components associated with any of the components in the associated tower. The blocks along one side of the rack, such as block 31, are interconnected with an AC power bus energized by the power entry unit or units in base 11. In a typical installation, this power bus has single phase or multiple phase AC power introduced to it although it could contain DC power connections in addition to, or in place of, the AC power. The blocks on the other side of the rack, such as block 32, can contain data communication connections such as for an I/O bus or the like. This bus is coupled to one or more of the elements such as 33 and might take the form of a SCSI bus for data exchanges and communications with other elements and even an external host attachment or communication network.

Features are mirrored from top to bottom and are mirrored from inner to outer panels of the tower building blocks. Both the top and the bottom of any given block in accordance with this invention can function as the upper surface. A latch is located in the bottom of each tower building block whether it functions as the left or right block. As is visible in FIG. 6, there are three alignment pins A, B, and C for each tower building block side. The center pin A provides both X and Y axes location while end pins B and C provide Y axis location. Pins A-B also provide shear strength in their location directions.

Figure 4:
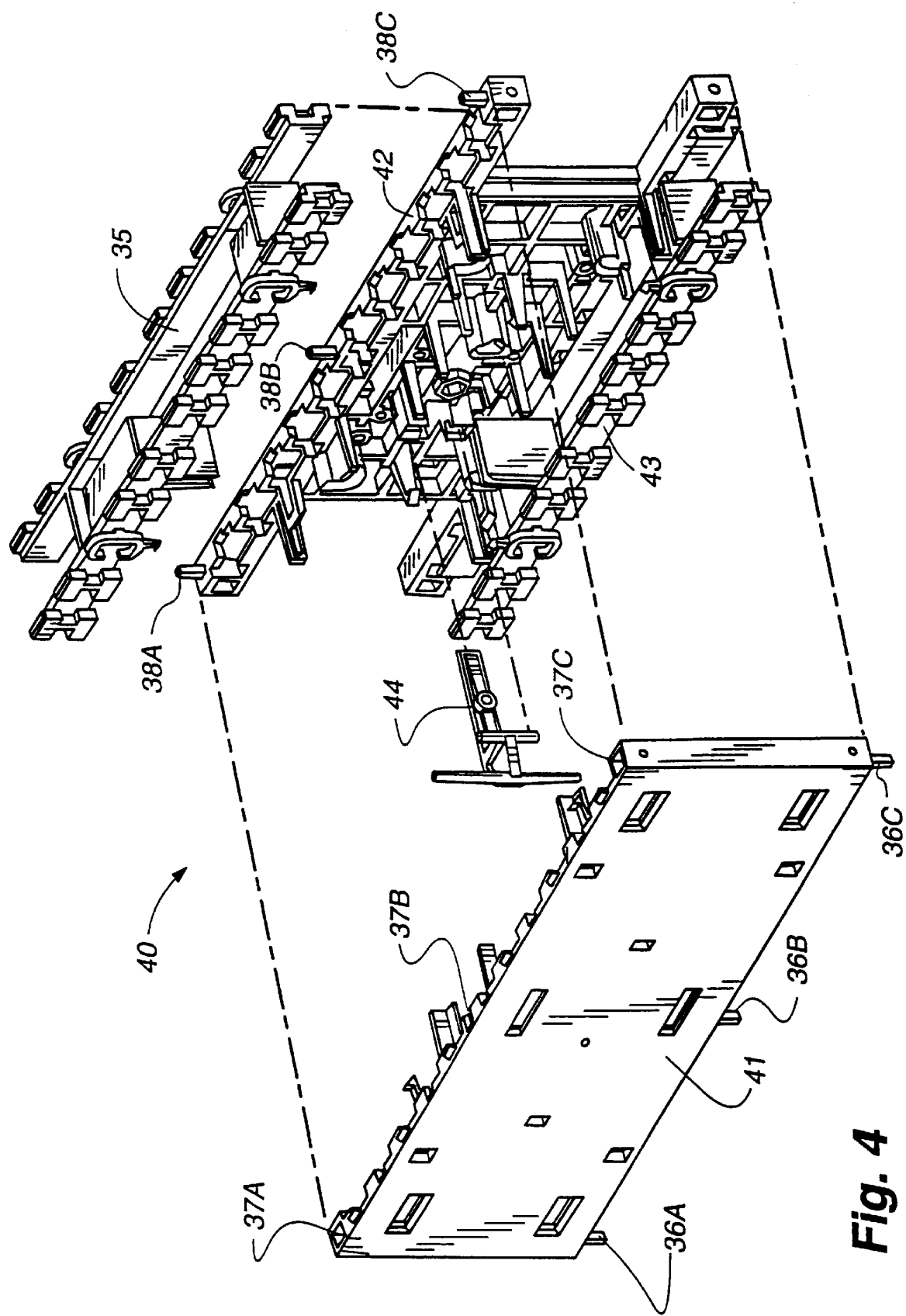
FIG. 4 is an exploded, left-hand view of the components of a tower building block in relation to the securing latch of the block immediately above in accordance with the present invention.

FIG. 4 is an exploded, left-hand view of the components of one tower building block 40 which forms one side of a block unit. Block 40 is shown in relation to the securing latch 35 component of the block immediately above in accordance with the present invention although latch 35 is shown inverted from its normal position when it is attached to the panels of another block. Block 40 includes an outer panel 41 which faces toward the exterior of the associated block unit, an inner panel 42 the outer surface of which faces the interior of the rack once assembled, a sliding latch 43 similar to latch 35, and a pivoting cam lever 44 which is manually moveable to slide latch 43 between latched and unlatched positions. Note that both slide latch 43 and cam lever 44 are retained between panels 41 and 42 when block 40 is assembled.

Sliding latch 35 is similar to slide latch 43 and is inserted from the top as shown and similarly retained between the panels in the block 40 if block 40 is intended for use on an opposite side of the rack column. While a block could contain two slide latches, one on each side (as when other mating blocks had no sliding latches), normally a block would retain only one slide latch. Further, the location of the slide latch within the block would determine the side of the rack column on which that particular block is to be used. This is implemented by placing an array of stubs or alignment pins along one side of each panel and a mating array of receiving holes or grooves. Typical pins are shown and 36A, 36B and 36C with mating receiving receptacles, or holes, 37A, 37B and 37C for panel 41. Panel 42 has a similar arrangement of pins and receptacles but only pins 38A, 38B and 38C are visible in FIG. 4 for panel 42.

Whenever the block of one side of a rack are intended to contain a power connection while the blocks on the other side of the rack are intended to convey an electrical communication connection, it is preferable to construct the blocks so they are only capable of interlocking with other blocks on the appropriate side for power or communications interconnections..

Figure 5:
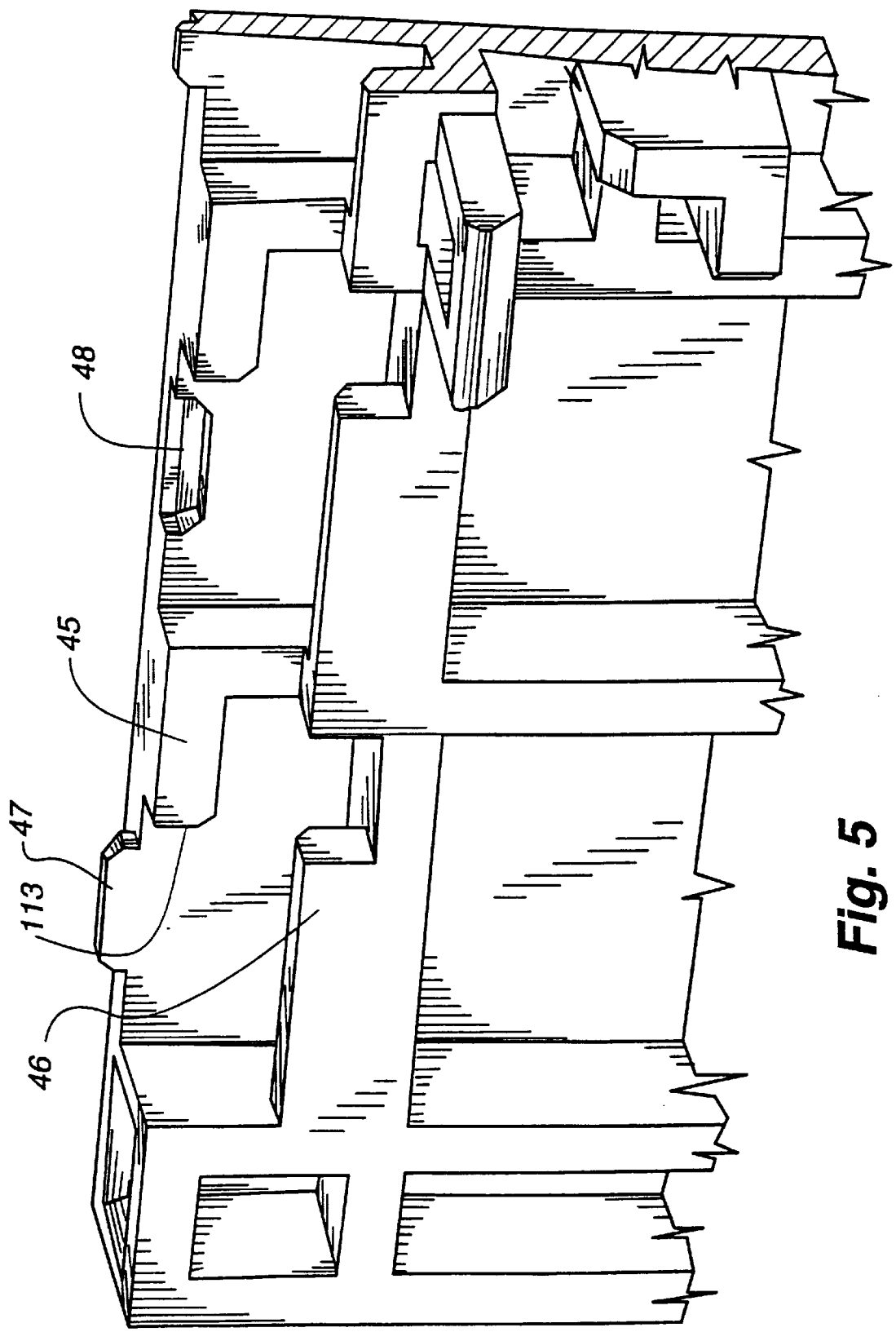
FIG. 5 is an expanded view of a portion of the latch receiving components associated with a tower building block.
Figure 6:
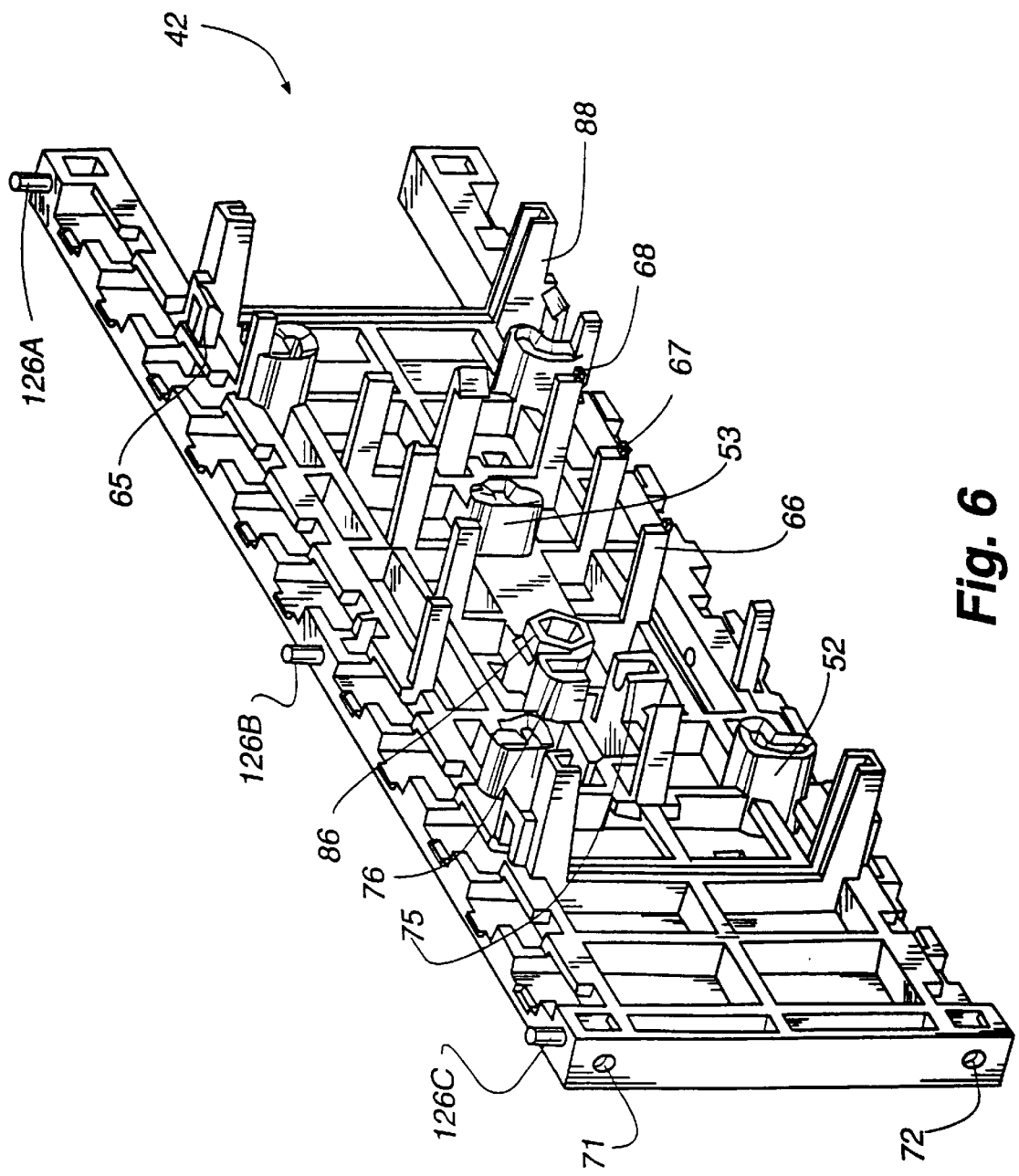
FIG. 6 is a view of the inner panel for a tower building block.

FIG. 5 is an expanded view of a portion of the latch receiving components associated with one of the panels of a tower building block. In FIG. 5, shoulder 45 accepts tensile loading for the latch. Shoulder 46 provides side support to assist the latch thereby minimizing stresses. Tabs 47 and 48 provide fine alignment and location, as well as shear in both the X and Y axes in an assembled tower. Braces 50 and 51 shown in FIG. 7 and cradles 52 and 53 in FIG. 6 provide course and fine alignment during assembly of the outer panel to the inner panel. They likewise provide shear strength in the X-Z plane for the tower building block assembly, while these braces and cradles provide Y axis location for the assembly and hold the block assembly together without the need for fasteners.

Figure 7:
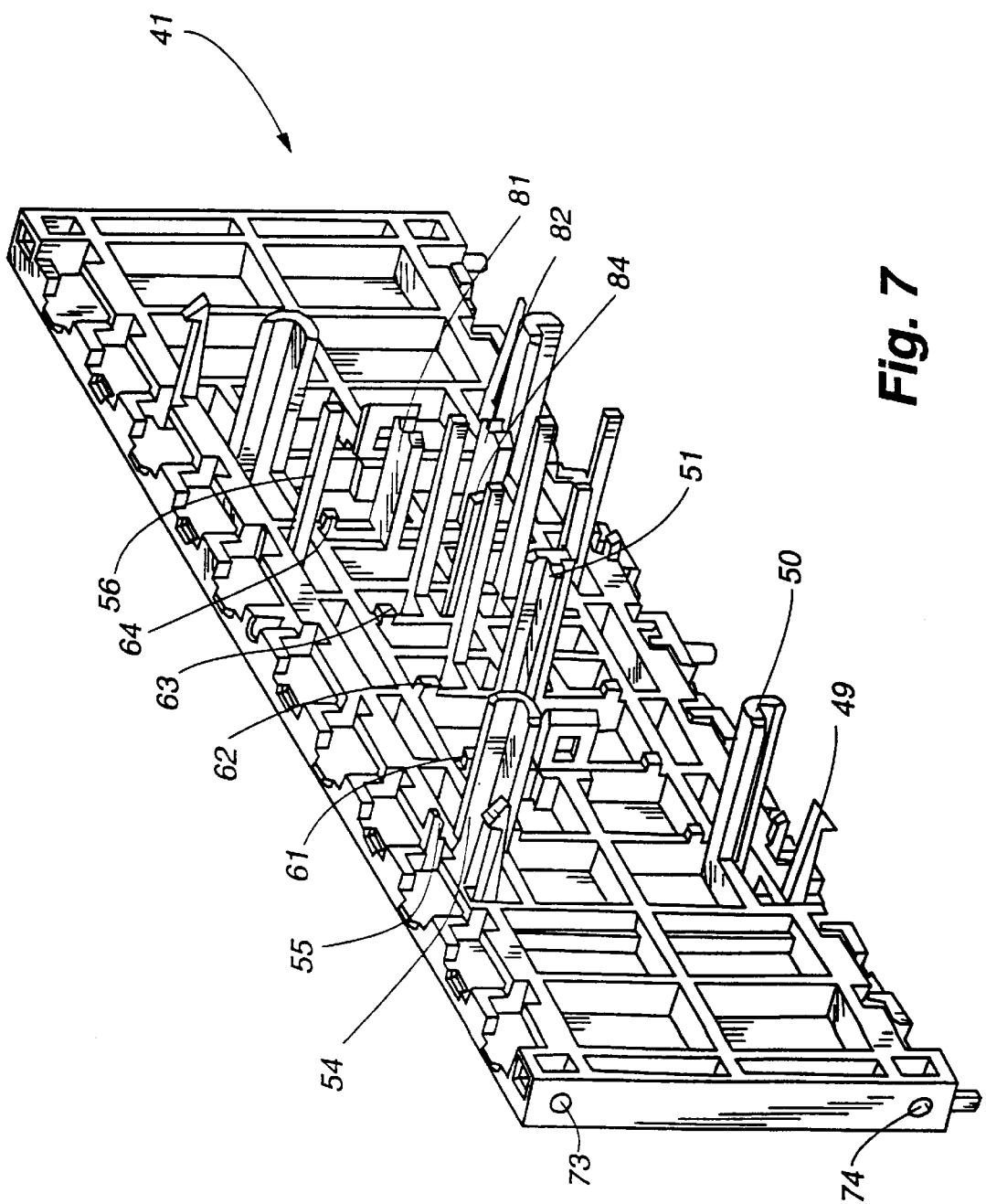
FIG. 7 is a view of the inner face of the outer panel of a tower building block.
Figure 8:
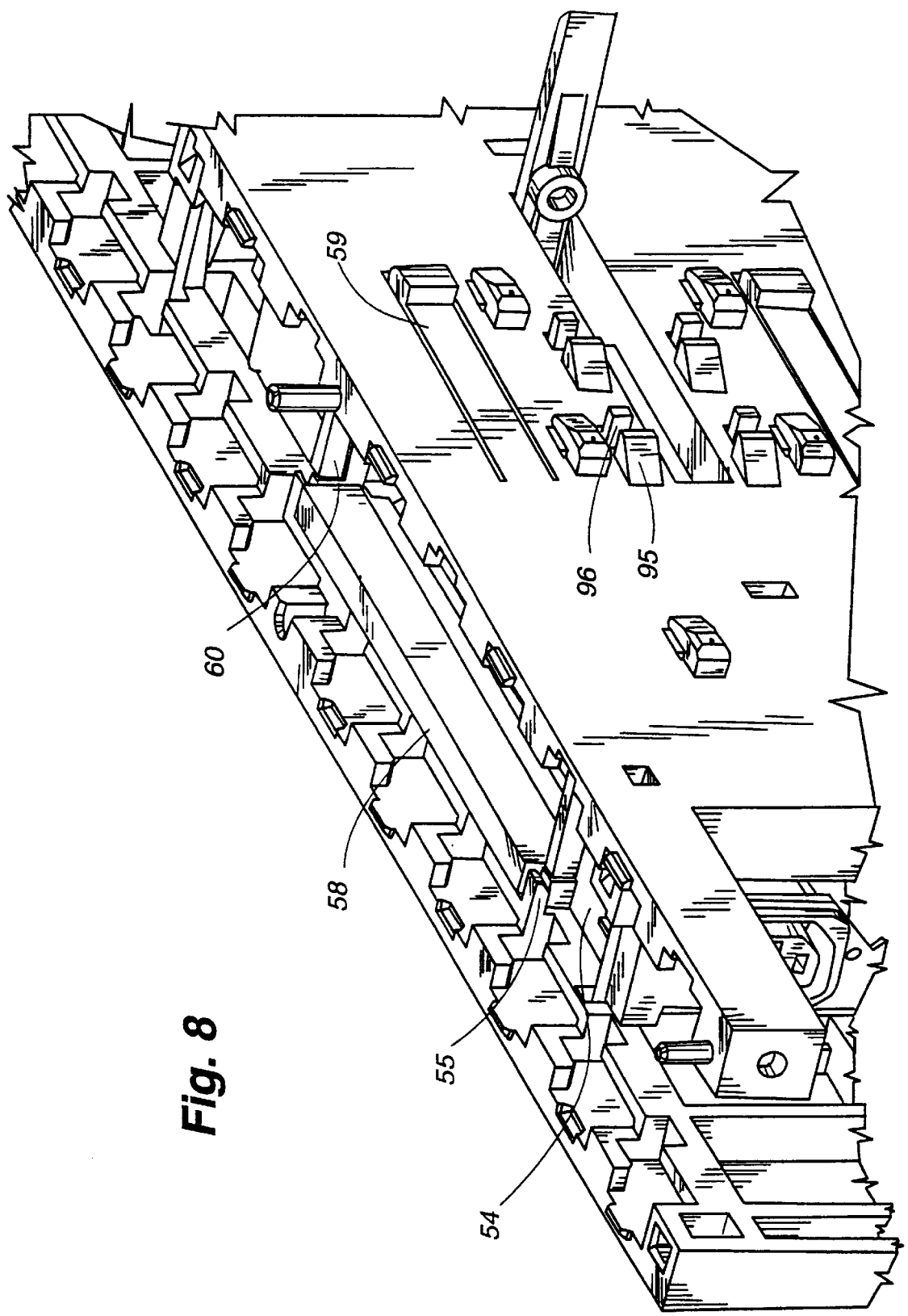
FIG. 8 is a close-up view of a portion of a tower building block with both panels assembled.

Connector support is provided by two posts on both sides of the outer panel; namely, posts 54, 55 and 56 in FIG. 7, while only 54 and 55 are shown in FIG. 8. This provides Z axis support as well as X axis location for the power or I/O bus edge card connector 58. Tall posts such as 56 in FIG. 7 act as stops for the mounting bracket latches 59 of FIG. 8. Single posts, such as 60 in FIG. 8, located on both ends and mirrored on inner panels provide Y axis location by trapping the connector 58 to the ribs of the outer panel.

For printed circuit board supports, four knobs, such as knobs 61–64 in FIG. 7, space the board 58 from the ribs of the outer panel. Three posts, such as 66, 67 and 68 in FIG. 6, on the inner panel top and bottom provide location and spacing. Holes 71 and 72 in FIG. 6 and 73 and 74 in FIG. 7 for the front and rear of the inner panel 41 and of the outer panel 42 are mounting features for end caps, doors, or the like.

Figure 11:
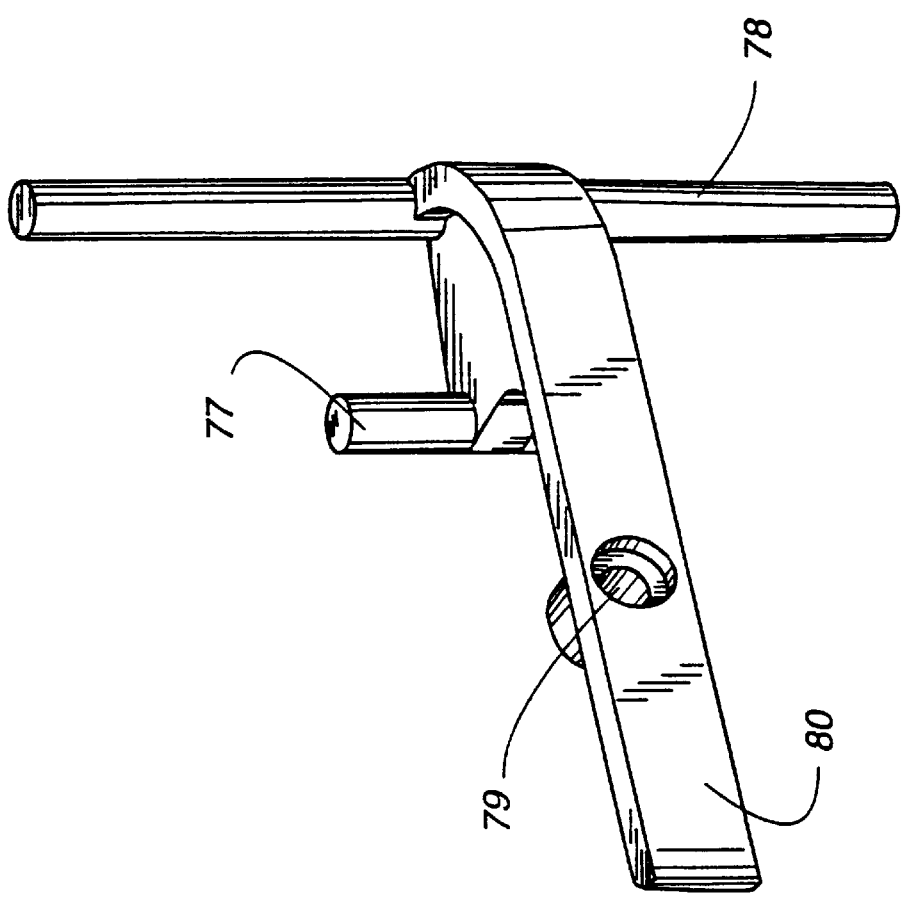
FIG. 11 is a cam and lever structure for a tower building block.
Figure 14:
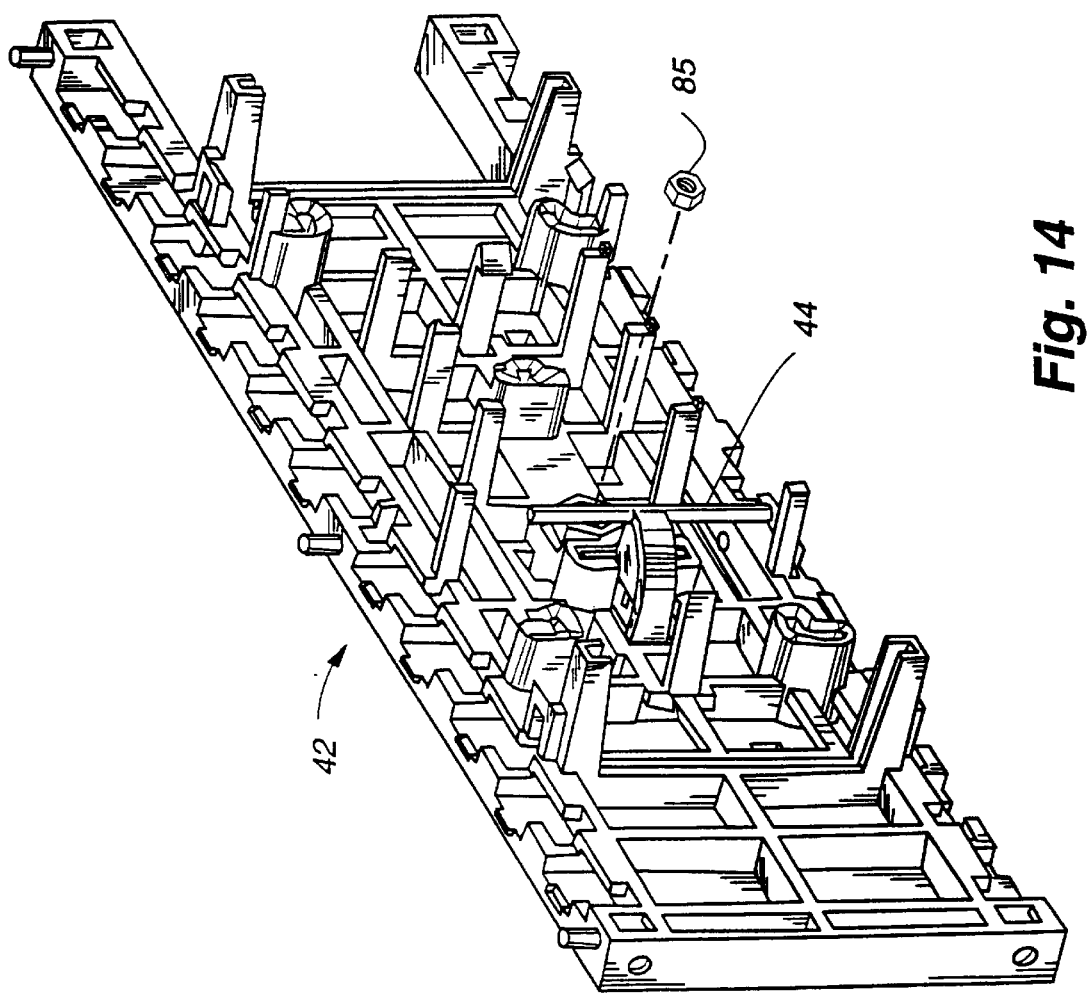

Cam axle cradles 75 and 76 in FIG. 6 locates the cam lever 44 during assembly while giving X, Z and -Y axis location and support to the axle 77 of cam lever 44 (note FIG. 11). Cam supports 81 and 82 of FIG. 7 gives positive Y axis location and support to the axle 77 of cam lever 44. Nut pocket 86 of FIG. 6 gives location to a standard nut (type 10-32, for example) during assembly. Pocket 86 also gives linear and rotational location and support to all but the negative Y axes. Boss 87 of FIG. 7 provides Y axis support to the nut 85 (FIG. 14). Boss 87 in FIG. 7 provides -Y axis support to nut 85 along with providing a clearance hole for screws to penetrate beyond the depth of the nut. An inner frame 88 (FIG. 6) provides location for a safety cover during assembly while an outer frame FIG. 7 completes the location of the safety cover for operation.

Figure 9:
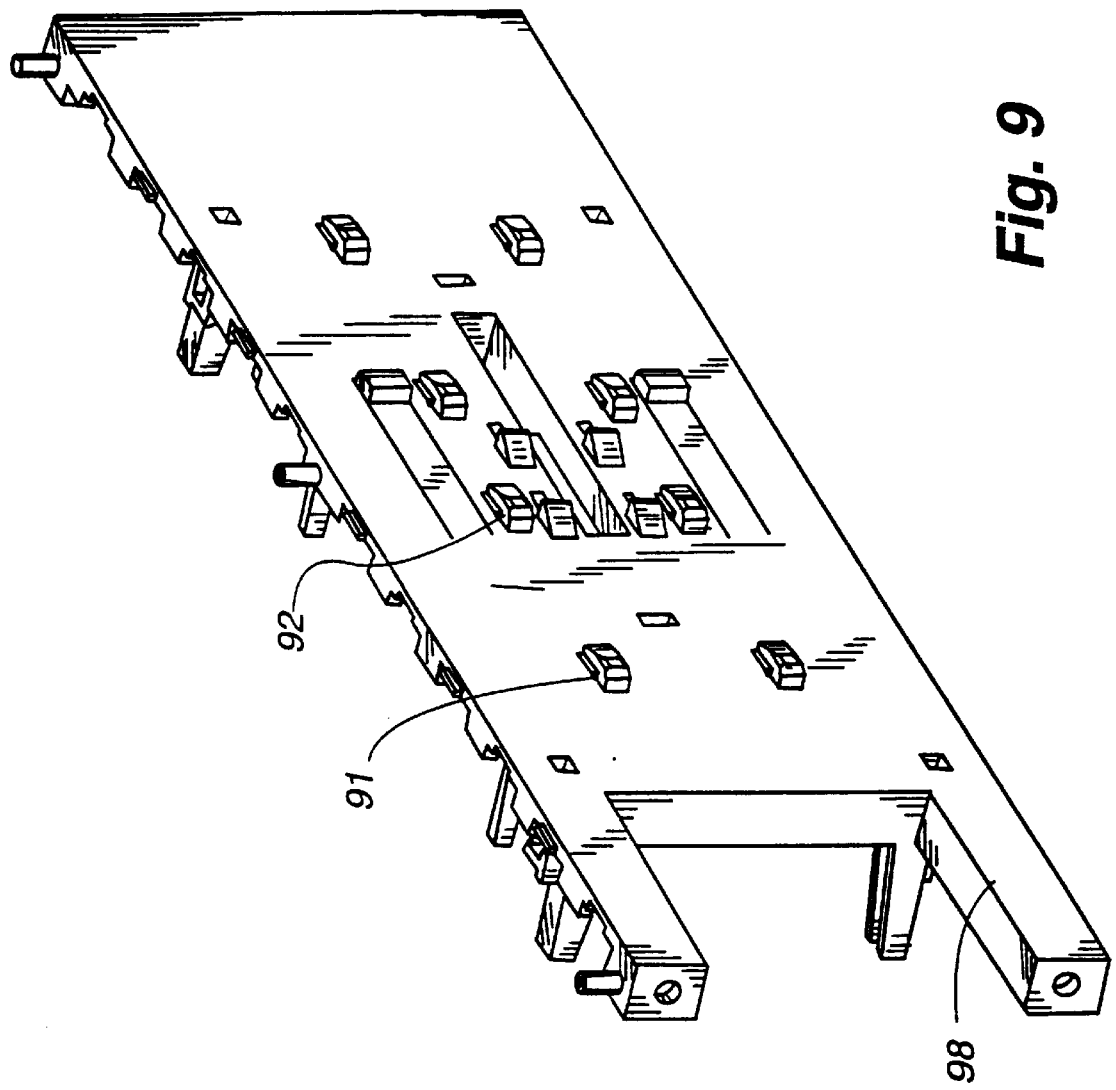
FIG. 9 is an isometric view of the surface of the outer panel of a tower building block.

Positive X axis location and shear for the mounting brackets is obtained from mounting bracket snaps 59 in FIG. 8 allowing toolless mounting bracket installation and removal. For example, these snaps 59 can respond to only five pounds of force per snap to deflect that snap for bracket installation or removal. As seen in FIG. 9, eight mounting bracket catches such as 91 and 92 each have a relatively narrow gap to establish mounting brackets with Z and Y axis location and shear support with a secure fit. In FIG. 8, four mounting bracket stops such as 95 provide added cross-sectional area for shear strength to posts, such as 96. The latter provide negative X axis location and shear control and are allowed to deflect to provide a return force (e.g.: 0.1" to 0.15" deflection to provide 10 to 15 pounds of force) against the snap.

As depicted in FIG. 9, a rear cable access opening 98 allows access for cable connections, such as for an AC cable connection to an AC power bus or for an I/O cable and cable routing.

Figure 10:
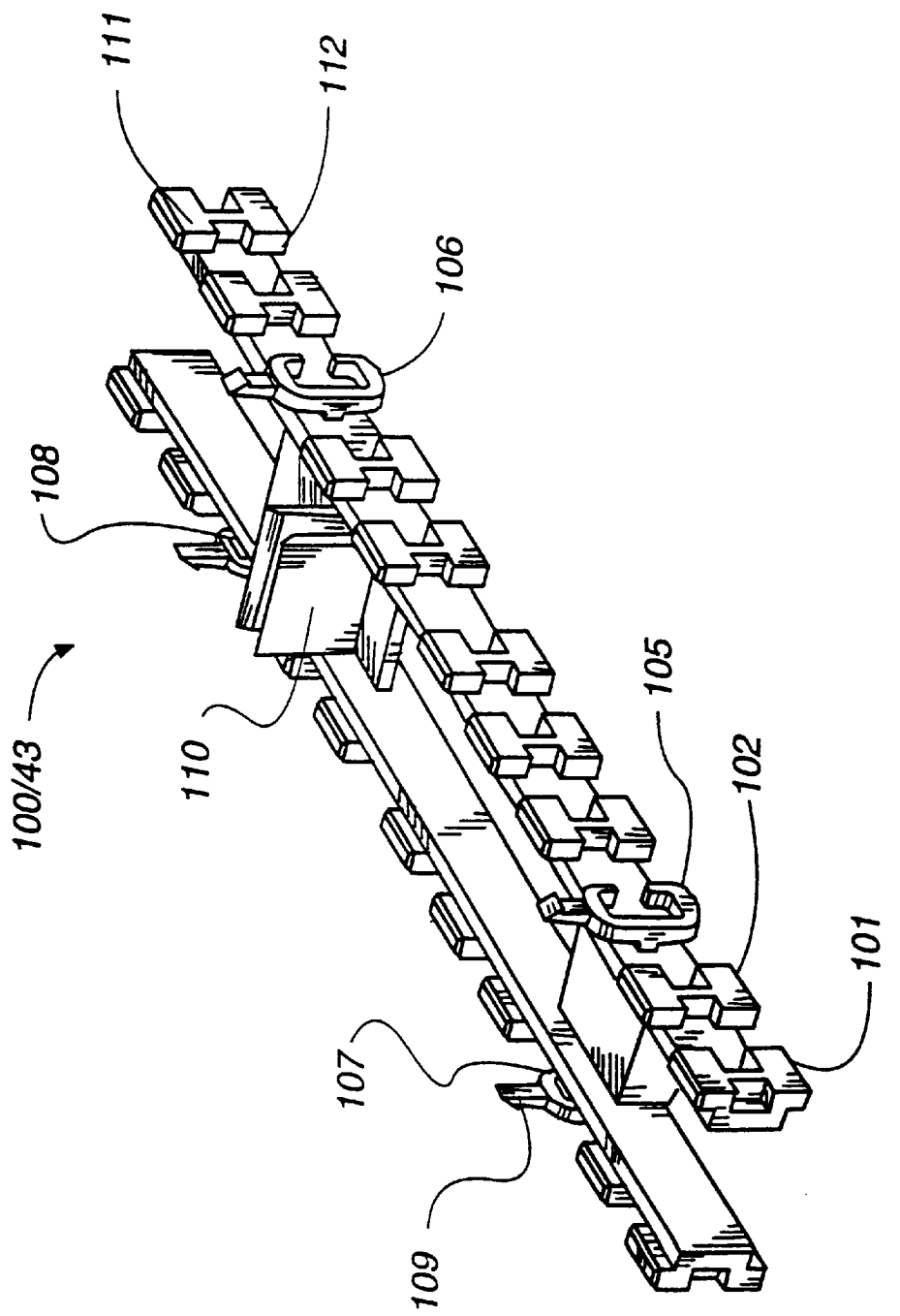
FIG. 10 is a view of the slidable latch component of a tower building block.

FIG. 10 presents a typical sliding latch component 100 which includes eighteen latch elements, such as 101 and 102, thereby promoting tensile strength for tying successive tower building blocks together. Each latch element drops into a vertical opening in a lower tower building block when the latch is in its open position. Latch component 100 slides forward, such as by 0.5-inches, to engage the latch features on the mating tower building block inner and outer panels. The latch elements do not contact the tower building block inner and outer panel unless the tower is stressed.

Sliding latch component 100 also includes four C-shaped springs 105–108 each centrally attached to component 100 to allow the upper and lower arms to flex. The spring channels provide 5–15 pounds of clamping force tying stacked tower building blocks together. Springs 105–108 are staggered to minimize the force needed for latch engagement. Flexible snaps, such as 109 on each C-shaped spring channel, holds the latch 100 to the bottom of the associated tower building block. A cam receptacle 110 is formed as an integral part of latch 100 and is configured to receive the cam arm 78 (FIG. 11) while minimizing the necessary length of that cam arm 78.

The cam 44 is shown in FIG. 11. Cam arm 78 engages the cam receptacle (i.e.: 110 in FIG. 10) for selective sliding back and forth. Hole 79 in arm 80 of cam 44 is to receive a safety screw so as to retain the blocks in interlocked relationship once the assembly is completed. However, as shown, cam 44 is configured with an over-center rotation (e.g.: ten-degrees) to lock it in position for temporary assembly or to hold the blocks in connection until the screw is placed through hole 79.

Although not shown, the electronic module retained by a given shelf can engage mounting brackets on the inner facing surface of the inner panel of each tower building block. One example is a C-channel bracket similar to BA35x mounting brackets for SW2 shelves. Another example is a 150 mm metric rail segment for mounting half depth nineteen inch rackmount equipment (i.e.: TZ875 and TZ 885) which allows use of standard mounting equipment for these units. Note that mounting bracket engagement of a shelf can provide some stability to the tower building block assemblies to which it is attached.

As seen in FIGS. 1 and 2 and, to some extent, in FIG. 3, end caps can create cosmetic front and rear surfaces for the tower structure by attaching to the outer surfaces of the panels, for instance. Decorative polystyrene injection molded plastic is generally suitable for this purpose. They can snap into the front and back surfaces of the blocks while providing access and cover for cable raceways. Side panels also of decorative polystyrene injection molded plastic and surface labels can snap onto the outer panel outside walls. A top cover also of decorative polystyrene injection molded plastic can interface with the latch features of the upper tower building blocks to provide tie and safety covers therefor.

Figure 12:
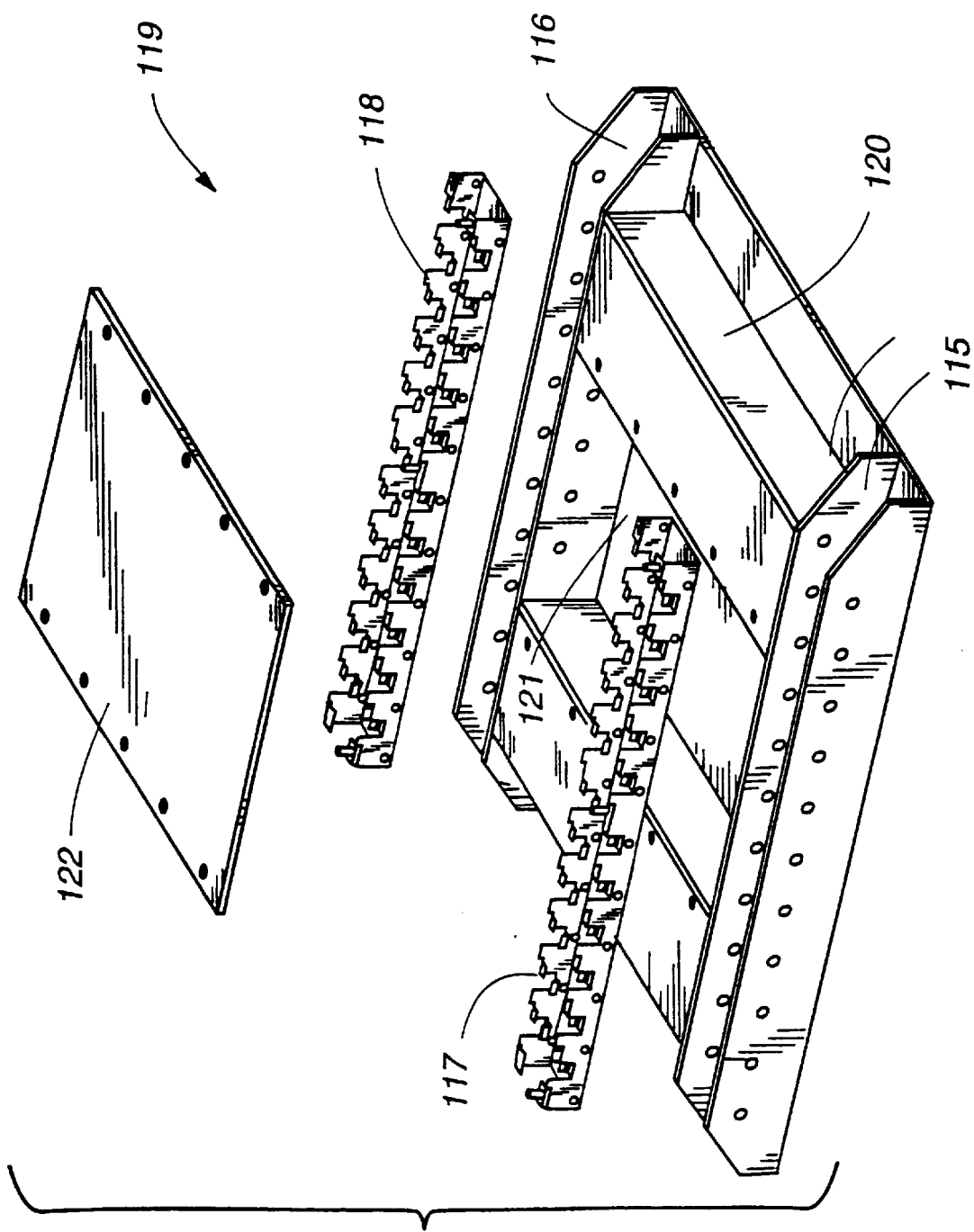
FIG. 12 is an exploded view of a base assembly tower building block.

A typical base unit, such as 11, is shown in somewhat exploded view FIG. 12. Generally U-shaped channels 115 and 116 provide strength to support the weight of the shelves under a load (such as ten 85 pound shelves under a 20 G load). The base unit can include weld nuts for leveler feet, not shown. Dual latching channels 117 and 118 replicate the latching feature of a tower building block such as by sheet metal folds. Alignment pins and receptacles are otherwise provided by the engaging tower building blocks. Either of channels 117 and 118 can further include mounting posts for an AC power initiator printed circuit board or boards. Base plate 120 can include castor mounts (not shown) and a channel 121 to pass AC cables from CDU's to the AC initiator PCB. The power connections can include single phase or multiple phase AC power and/or DC. Base cover plate 122 covers the channel 121 and provides enhanced torsional stiffness.

With regard to assembly of the tower building blocks, the same components make up both the left and right side blocks. That is, a left side block is created by flipping a right side block 180-degrees about the X axis and replacing the AC bus printed circuit board with an I/O bus printed circuit board, or vice versa. For top down assembly, the accept latch requires a reorientation (note FIGS. 13–19). Once assembled, the latch of a given block determines whether it is a right side or left side block relative to the particular base unit involved an rack configuration above it. No fasteners are required for the assembly of a tower building block although a press may be required. All features are chamfered to ease assembly.

The base assembly shown in FIG. 12 uses the same U-channel and latch racket on both sides. A base unit along the lines of FIG. 12 defines the left and right sides of the tower that will become assembled above it. This is because of the orientation of the pins and aligning holes along the edges of the panels in each block. For example, with the pin orientation established by base unit 119 of FIG. 12 and with reference to FIG. 4, the placement of latch element 43 in block 40 would render that block a right side block, whereas insertion of latch element 35 would render it a left side block. Preferably, the latch bracket is riveted into the U-channel to avoid plating problems. It is also possible to install the AC bus initiator, a printed circuit board, at the time of manufacture. The base cover plate 122 can be permanently attached as by riveting, bonding or the like, or it can be removably attached at the discretion of the manufacturer. Removable attachment allows AC configuring of the base at the manufacturers facility or at the user site. For example, this permits relatively easy reconfiguration from single phase to three phase AC power source or sources.

Figure 13:
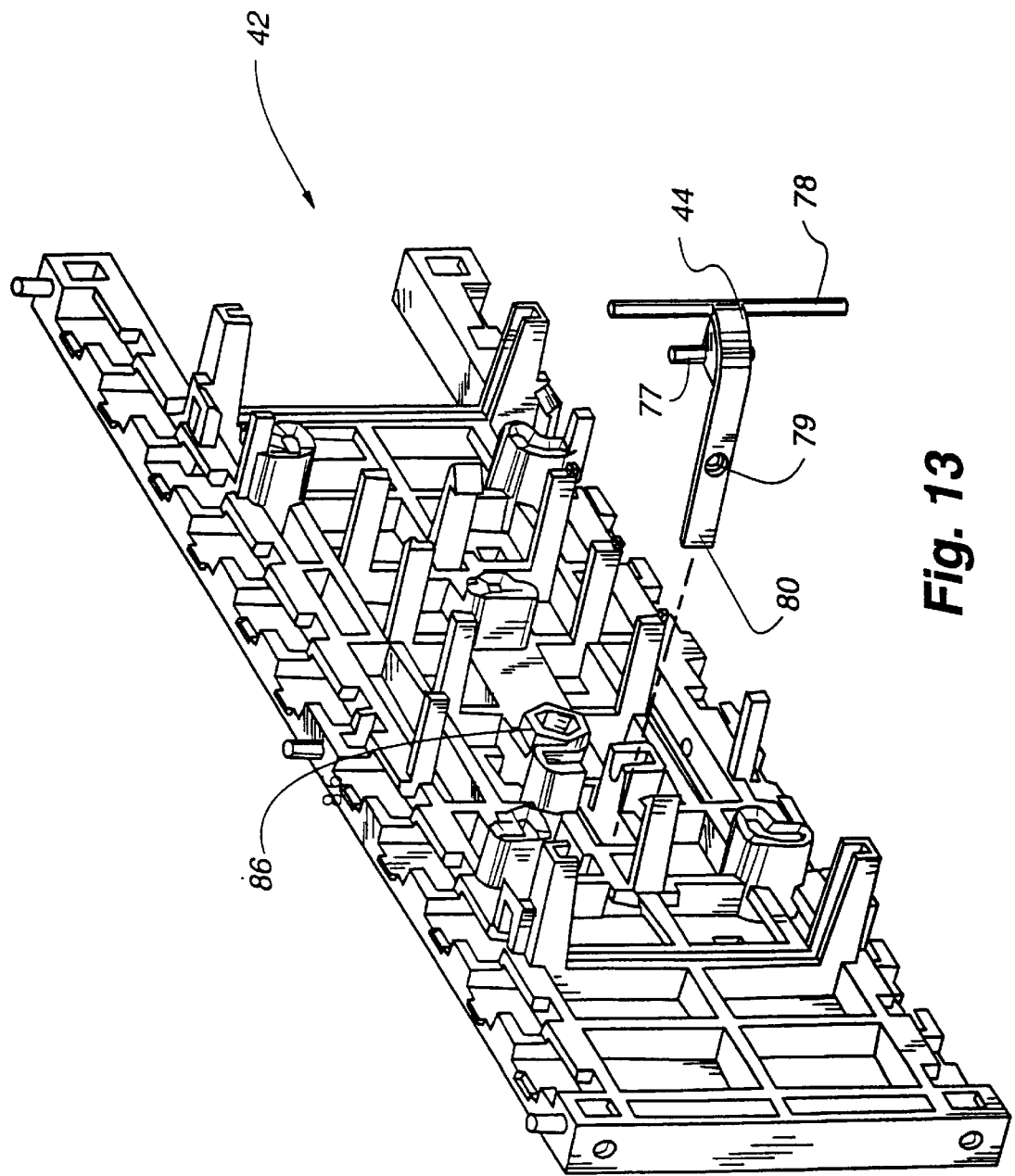
FIGS. 13 through 18 illustrate five sequential steps in assembling a tower building block in accordance with the present invention.
Figure 15:
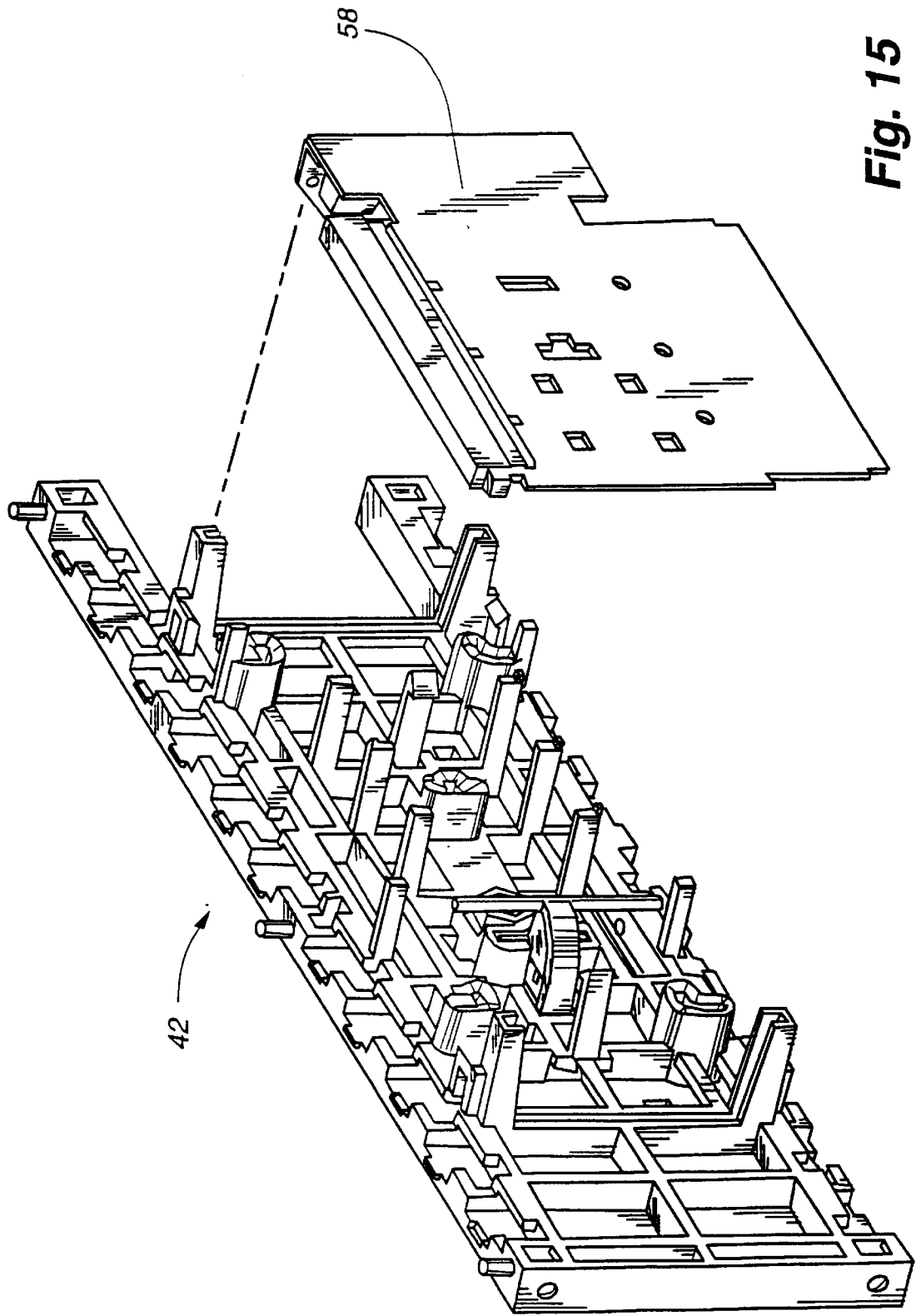
Figure 16:
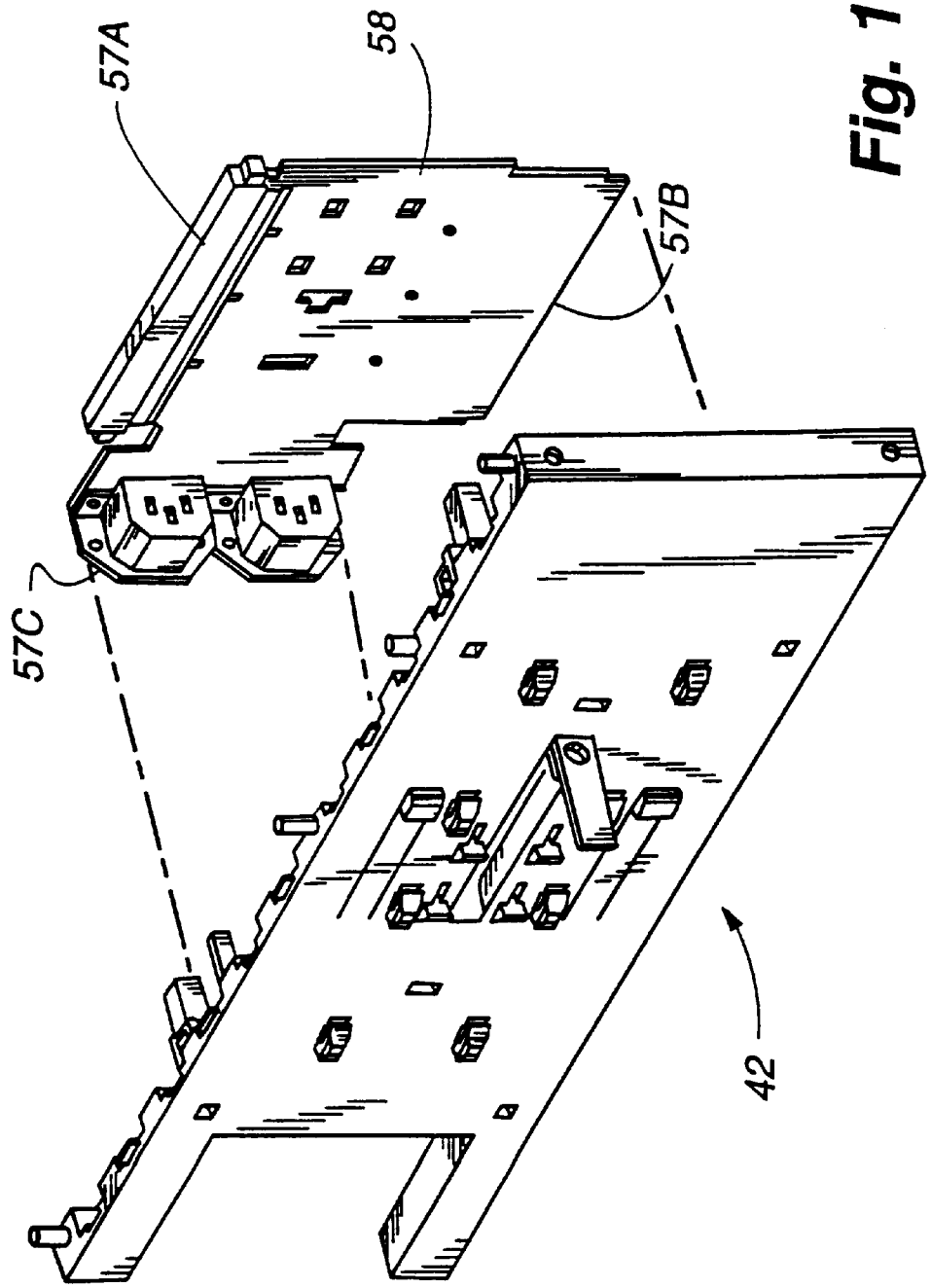
Figure 17:
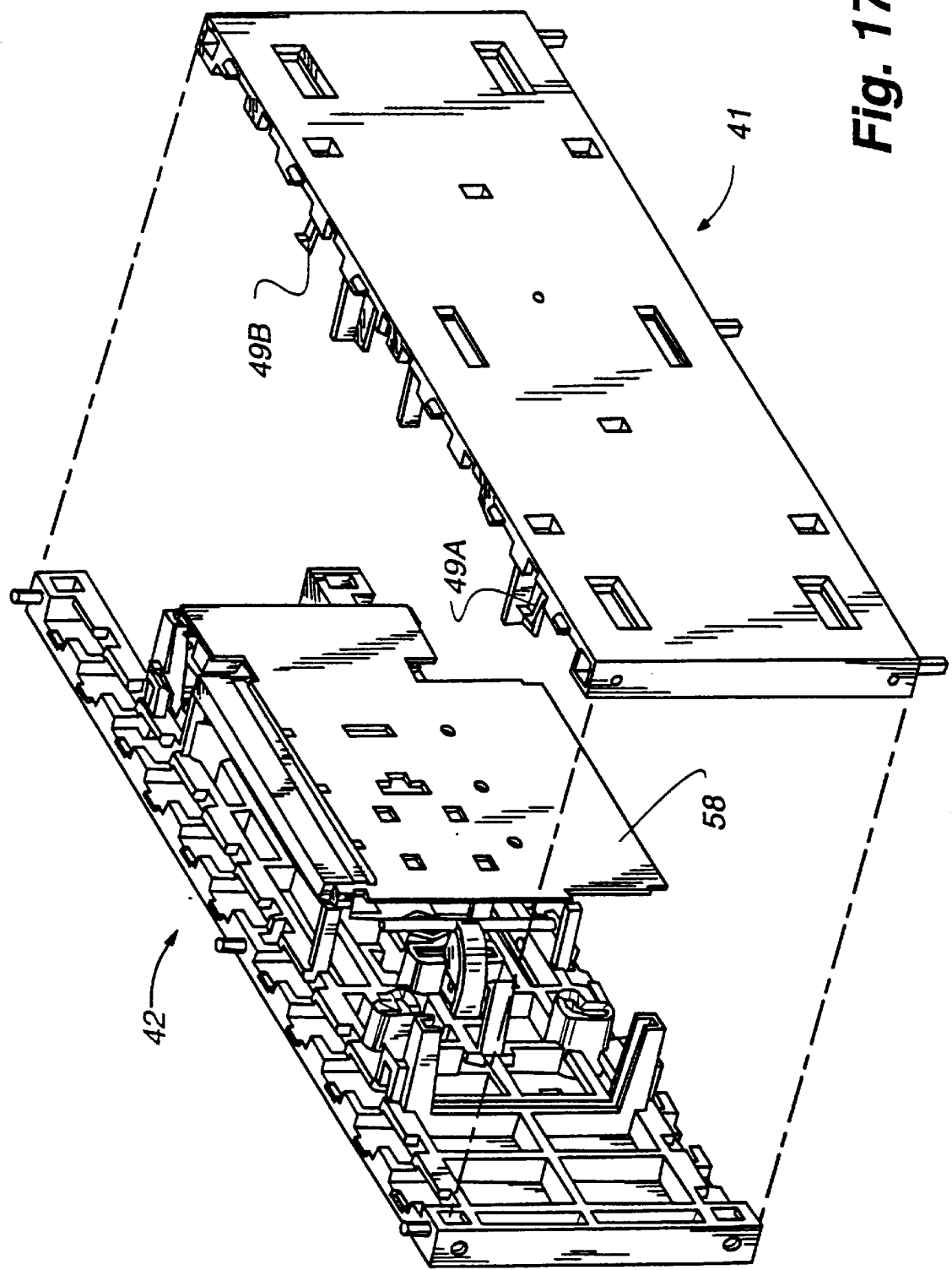
Figure 18:
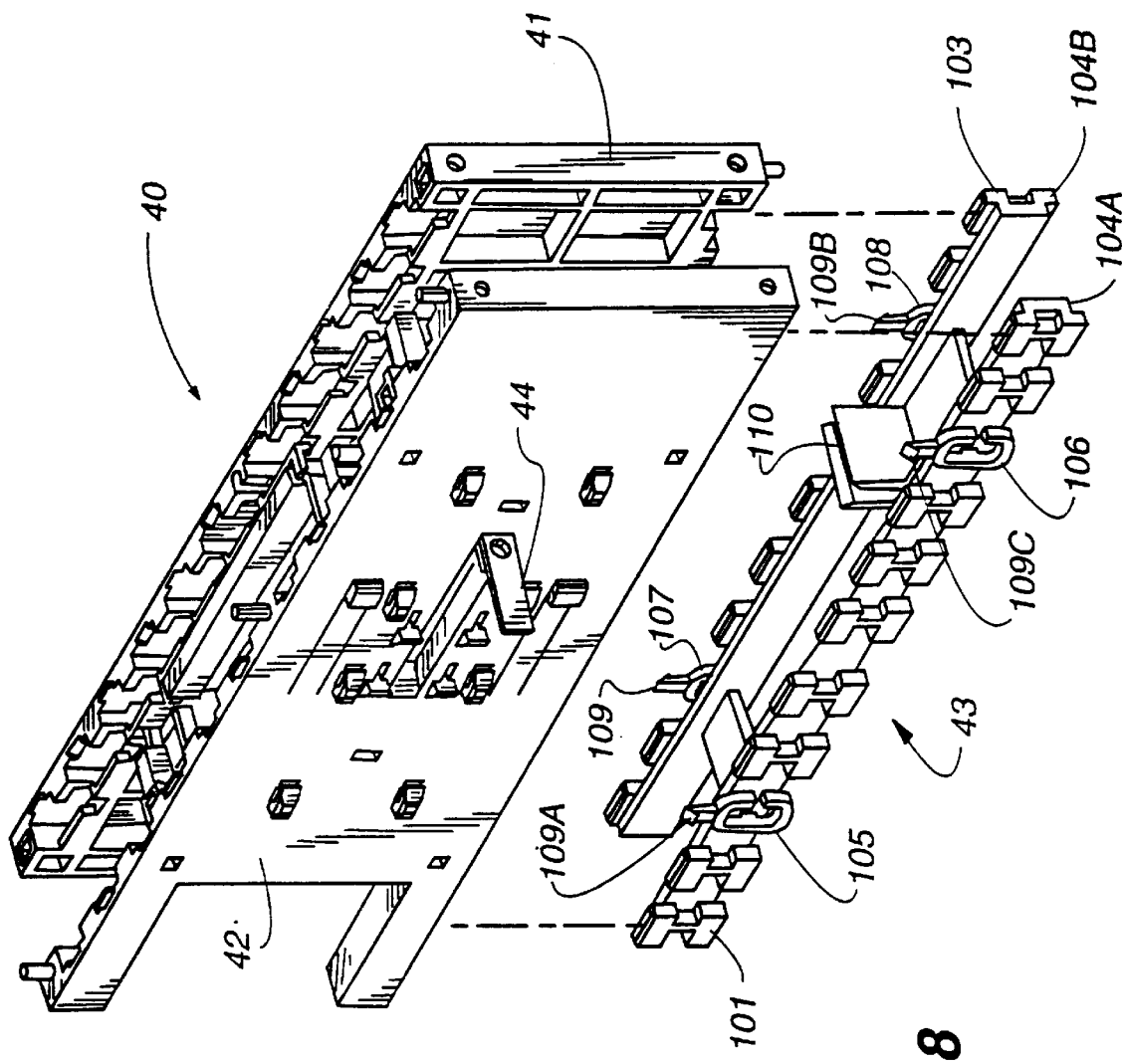
Figure 19:
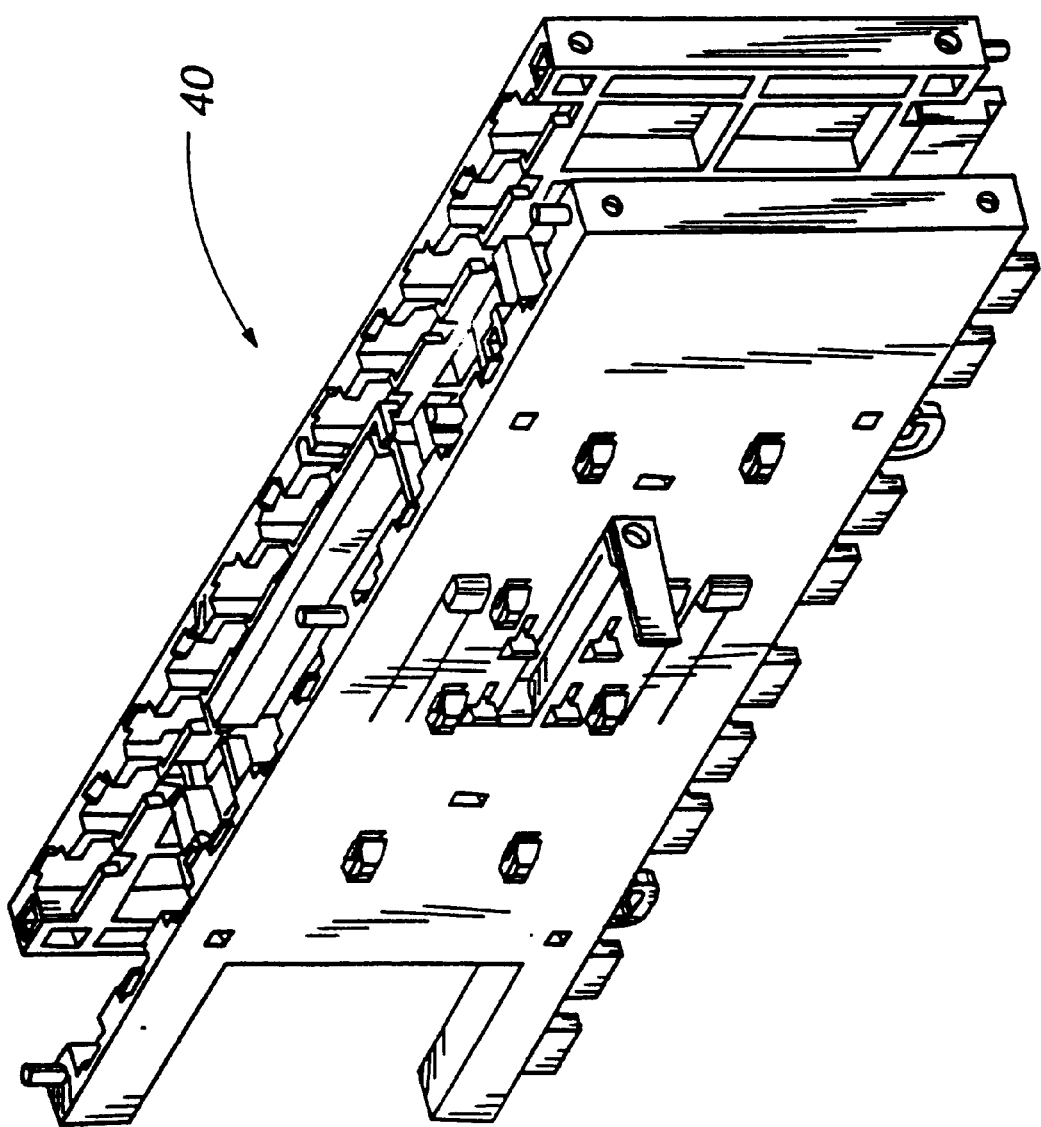
FIG. 19 shows the completed assembly of a tower building block pursuant to the assembly steps illustrated in FIGS. 13–18.

Assembly of block 40, a typical tower building block in accordance with this invention, is sequentially illustrated in FIGS. 13–19. Arm 80 of cam lever 44 is initially introduced through a slot in panel 42 as shown in FIGS. 13 and 14. In addition, a nut 85 is placed within nut pocket 86 where it will ultimately cooperate with a screw (not shown) passed though hole 79 in arm 80. Next, a printed circuit board 58, in this case an AC power board, is located relative to the retaining stubs and posts as shown in FIGS. 15–17. Board 58 is arranged with male and female edge connectors 57A and 57B, as well as outlets at 57C, for direct connection to the module retained in part by the final assembly of block 40.

Panel 41 is next attached to panel 42 with board 58 sandwiched therebetween via an array of snaps including 49A and 49B which engage receiver notches located on panel 42 as seen in FIG. 17 with either or both of the snaps and receivers being flexible. Sliding latch 43 is then inserted into the lower channel formed by the engagement of panels 41 and 42. For convenience, common reference numerals with the latch shown in FIG. 10 are employed in FIG. 18. Latch element 43 is constructed with elongated members 104A and 104B which are interconnected as integral units by webs, one of which includes cam receiver 110. Arrayed along the sides of members 104A and 104B are a plurality of latch elements, such as 101, 102 and 103, each of which is fixed to the associated member 104 with flexible C-springs 105, 106 107 and 108. Each C-spring is attached at its center to a member 104, but is otherwise free to flex especially in the vertical direction.

C-springs 105–108 each has a stub or snap element 109, 109A, 109B and 109C extending therefrom. These snaps are for the purpose of retaining the latch element 43 within the lower channel (which is formed when panels 41 and 42 are attached to one another to form block 40) until the latching cam lever 44 is actuated. As shown in FIG. 23, the upper portion of spring 107 including snap stub 109 is inserted into opening 135 contained in the bottom edge of panel 41. Stub 109 snaps over ridge 136 which extends along the inner surface of outer panel 41 so as to retain latch element 43 from falling out of engagement with block 40 whenever cam lever 44 is not actuated.

Actuation of lever 44 slides latch element 43 and hence C-spring 107 until it assumes the position shown in phantom in FIG. 23. This causes end face 137 of C-spring 107 to engage the upper surface 138 of shoulder 139 thereby establishing some closure force between latch element 43 and block 40. At that point, stub 109 has cleared ridge 136 as is apparent in FIG. 24. The C-springs are each under load when the assembly is completed. Since they are attached to the associated sliding latch element at the middle portion of their "C" configuration, the end faces of that "C" engage respective surfaces of the receiving channel thereby imparting a bias force between the joined components. Use of glass (e.g.: 5%) in the material for the C-springs will reduce the tendency of plastic creep for those components.

Note also that one of the ends of arm 78 on cam lever 44 is inserted between the two vertical plates of cam receptacle 110 when sliding element 43 is inserted into block 40. This permits cam lever 44 to slide latch element 43 along a line between panels 41 and 42.

To understand the sliding latch feature, assume sliding latch element 100 of FIG. 10 is reversed and inserted into the receiving arrangement shown in part in FIG. 5. Latch element 111 which, like its other counterparts, is configured similar to an "H" on its side so that it has an extending finger segment 112. Finger segment 112 is inserted into the opening beside tab 47 into the opening behind shoulder 46. When the cam lever is actuated, the latch element will slide so that finger segment 112 will slide under finger segment 113 of shoulder 45. Thus the latch element is locked in place and the associated blocks are secured in an abutting relationship. The array of these interlocking finger segments ensures a firm lock between the two associated blocks.

Figure 20:
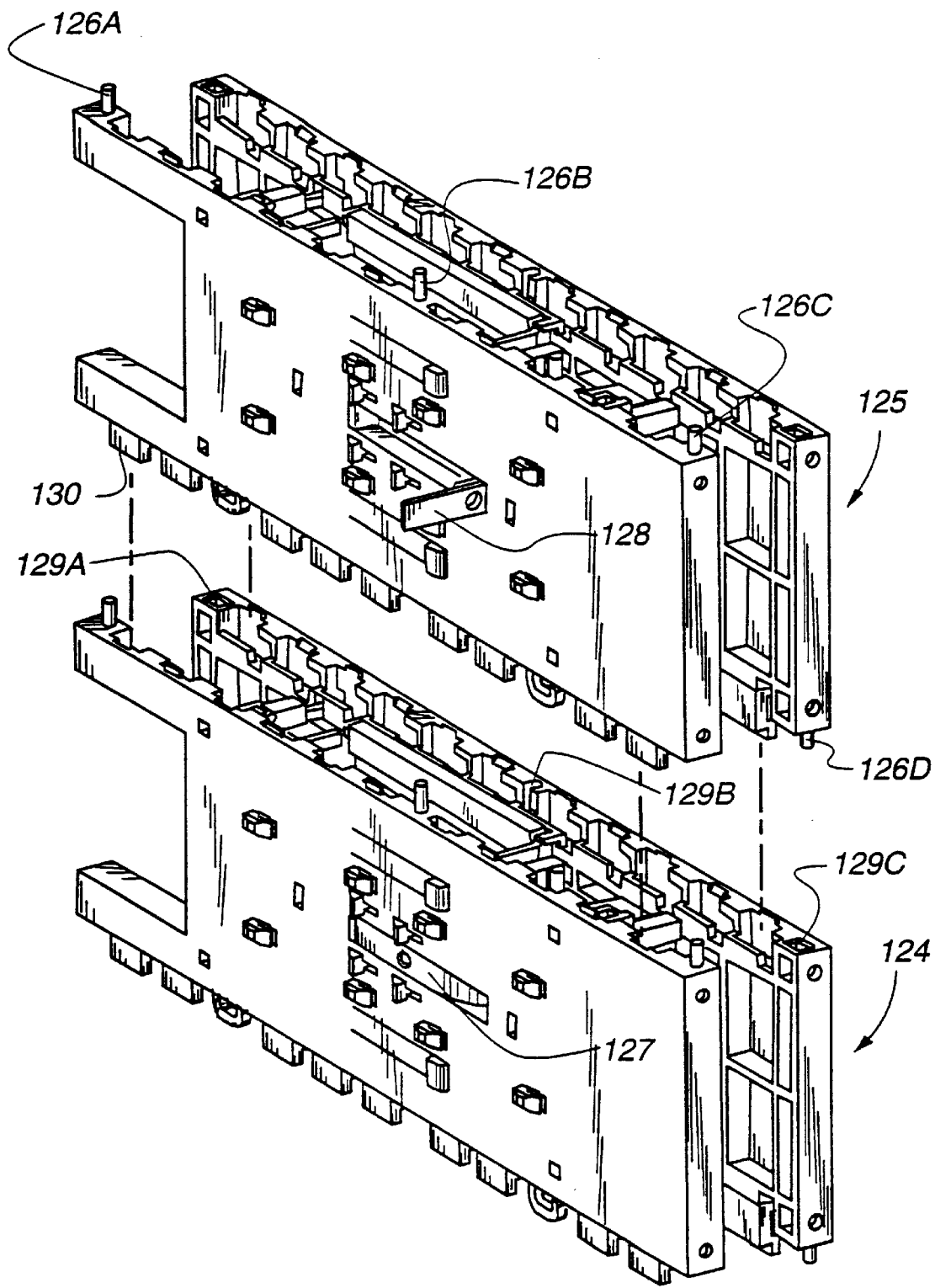
FIGS. 20 through 22 illustrate the steps in securing two tower building blocks relative to one another.
Figure 21:
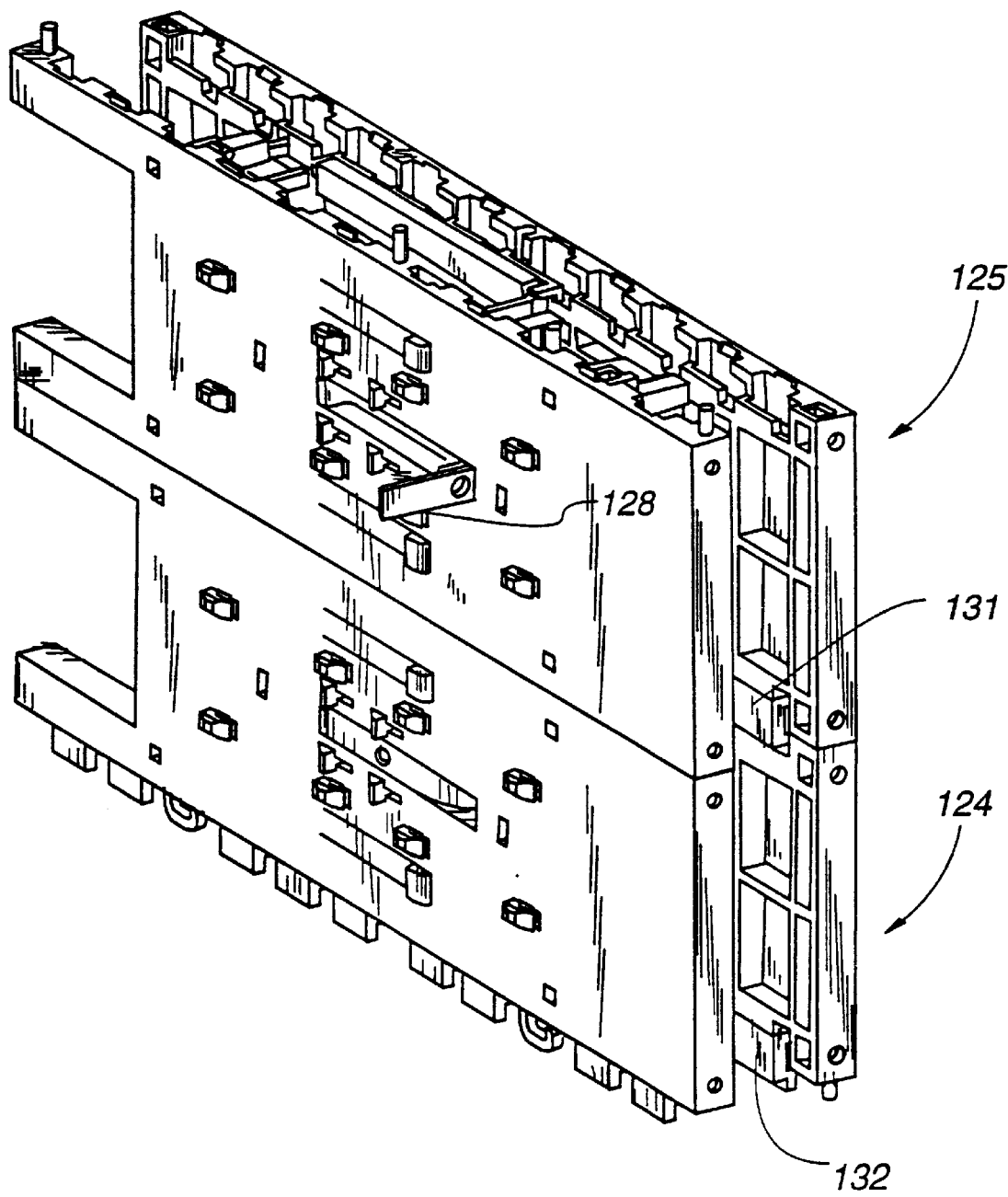
Figure 22:
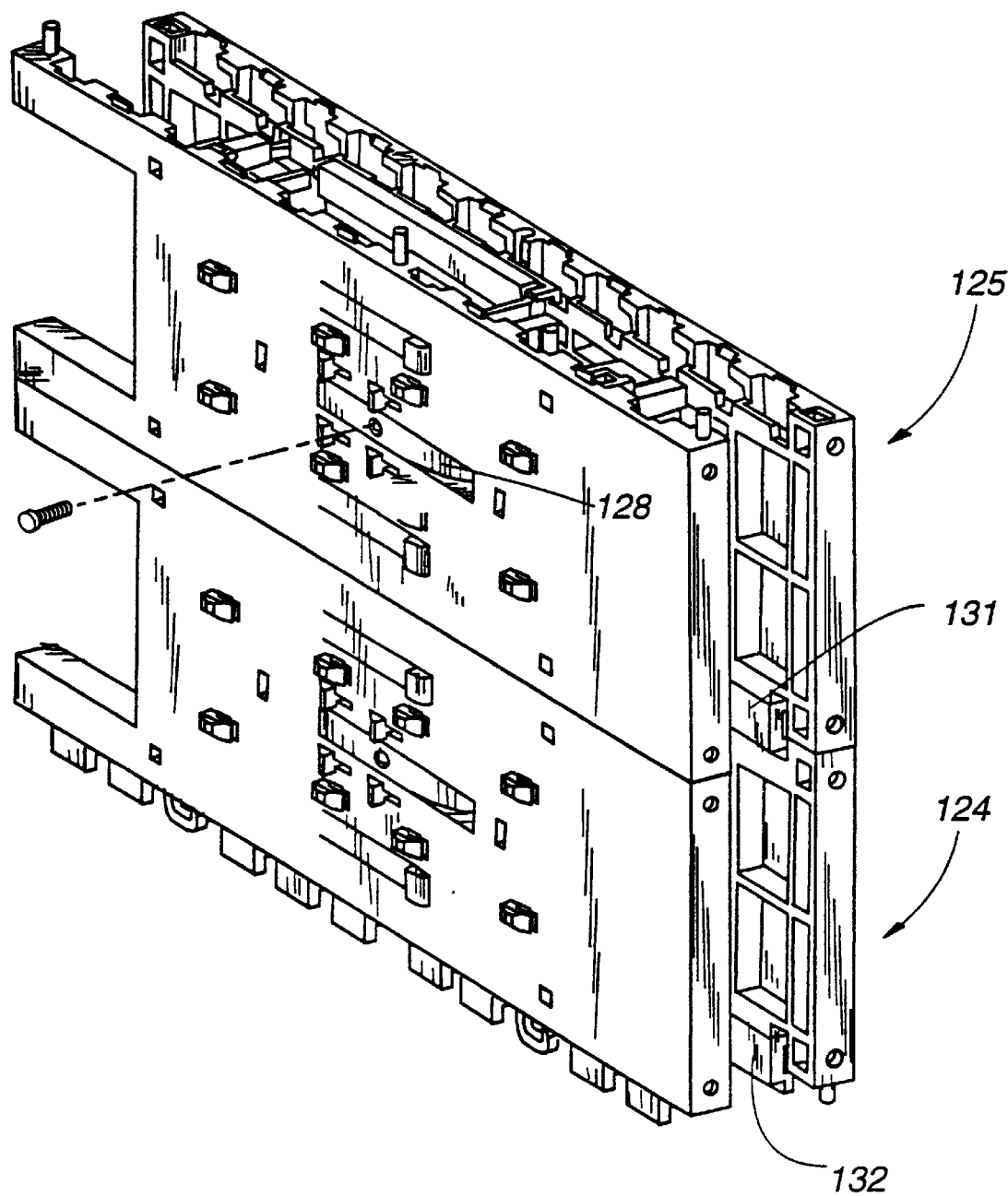

By use of this invention, and as illustrated in FIGS. 20 through 22, very rapid system assembly is possible since the AC bus extends automatically through each tower building block segment, thereby greatly reducing assembly time and associated costs. That is, in FIG. 20, tower building block 124 is already attached to the block or base unit below it as is evidenced by the closed state of cam lever 127. Block 125 is lowered so that its sliding latch 130 enters the mating elements associated with the upper portion of block 124 as is shown in FIG. 21.

In addition, stubs or pegs such as 126A–126C which are arrayed along the under side of block 125 (only stub 126D of this set being visible in FIG. 20) enter holes 129A and 129C, as well as notch 129B in the upper surface of the outer panel of block 124. Of course, it is preferable to configure stubs 126 and holes 129 with common cross-sections. Cam lever 128 is then closed, thereby locking block 125 to block 124. The latched condition is visible in FIG. 22 in that cam lever 128 is now flat with the surface of the outer panel of block 125. In addition, outer portion 131 of slide latch 130 is visible in FIG. 21 but, as seen in FIG. 22, has moved into the receiving channel on the right ends of blocks 124 and 125. Note that end portion 132 of block 124 is shown in FIGS. 20, 21 and 22 in the latched position relative to the block or base unit immediately below block 124.

Safety requirements are met by merely one screw per tower building block. Shelf mounting brackets are mounted without any fasteners. The cosmetic panels are attachable just prior to shipment to avoid scuffs and dings during system assembly. Thus, it is possible to employ one common assembly line with system "personality" added just prior to shipment, a feature particularly attractive for OEM system individualization by either the manufacturer or the vendor. A power entry unit can hot plug into the AC power bus with the only plugging required relating to its power cord. The assembled system has sufficient rigidity when properly configured to permit shipment of reconfigured systems of at least three to ten shelves.

In addition, the design is well suited for recyclability. Structural foam parts need no painting, since they are covered by cosmetic panels which themselves are not painted or labeled. It is possible to use sheet metal for all non-plastic parts with system labels located on the sheet metal. Still further, the design facilitates disassembly. Structural foam latches and snaps are potentially created by telescopes in the mold providing access for tools to perform disassembly. The nut in the structure merely falls out once the block is disassembled and the cosmetic panels slide off structural pieces.

All active components are replaceable without disassembly of the tower. Front removal of a power entry unit is possible after detaching its power cord at the rear (or vice versa) and without disturbing the I/O interconnections or cabling. While passive component failure may require tower disassembly, the prospect of such failures is low and only impacts the AC power PCB and/or the I/O bus PCB. It is possible to utilize external cabling in conjunction with this invention, of course. The shelf mounting brackets allows toolless installation and removal of modules with the same bracket used on both sides. There is open access to all features of each shelf at the front and rear of the system constructed through use of the tower building blocks of the present invention.

A typical block might weigh seven pounds and includes guide pins to provide easy alignment during system assembly. While connector insertion requires some additional force, the weight of the block itself assists with this process. The cam lever 100 is operable with relatively small force, such as about five pounds to open or close it.

While differentiation of blocks containing power and electrical communications boards was described above by use of configurations of arrays of mating pins and receptacle holes, other ways of producing this result are available to those having normal skill in the art. For instance, the elements associated with the blocks can all have a common assembly configuration, while the connectors associated with the boards retained therein can incorporate interlocking structures which prevent establishment of completed electrical connections unless the electrical paths involved are compatible.

The tower building block system is a cost effective, modular enclosure solution for a wide range of applications from small open office systems to high density mass storage environments. It satisfies the need for improved cable management within enclosures. The system is easily reconfigured by users, distributors, and resellers or sold preconfigured from the factory. Modularity of design of both structure and aesthetic panels facilitate quick and inexpensive generation of custom solutions.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. Apparatus for securely stacking of equipment modules between a pair of blocks, each said block comprising:
    first and second elongated panels retained in parallel with a space therebetween, so as to define elongated channels opening from opposite sides into the space;
    a latch element slidably mounted within one of said elongated channels and containing a first plurality of finger segments;
    the other of said elongated channels having an arrangement for receiving a said latch element of another said block and including a second plurality of finger segments for cooperatively engaging said first plurality of finger segments of said another block;
    a mount attached to an exterior surface of one of said panels for securely receiving an equipment module; and
    a lever for moving said latch element for shifting at least one of the pluralities of said finger segments between engaged and disengaged positions.

2. Apparatus in accordance with claim 1 wherein each said panel further includes:
    at least one alignment pin extending from one side of a said panel and at least one alignment pin receptacle on the opposite side of a said panel.

3. Apparatus in accordance with claim 2 which includes a board having electrical connections between opposite edges thereof, electrical couplings from said board to the said equipment module secured by said mount, and an arrangement for retaining said board in intervening but parallel relation to said panels with said opposite edge electrical connections accessible in respective said channels thereby establishing electrical connections between blocks when said latch elements are engaged.

4. Apparatus in accordance with claim 1 wherein said latch element includes at least one snap for retaining said latch element in the receiving said channel whenever said latch element is not engaged within a said channel of another said block.

5. Apparatus in accordance with claim 1 wherein said lever includes an over-center mounting between said panels and an arm externally extending from the surface of one of said panels.

6. Apparatus in accordance with claim 3 wherein each said panel includes a plurality of said pins extending from one side and a matching plurality of receptacles on the other side.

7. Apparatus in accordance with claim 6 which includes a plurality of said blocks each having a said board retained therein with some of said boards having power connections and the others of said boards having electrical signal connections.

8. Apparatus in accordance with claim 7 wherein said pins, said receptacles and said slidable latch elements for blocks having said power connections are positioned oppositely from said pins, said receptacles and said slidable latch in said blocks having said electrical connection boards retained therein.

9. Apparatus in accordance with claim 8 which includes a base unit having a pair of connections along a surface thereof for mechanically securing in spaced relation a respective said power connection block and a said electrical signal connection block.

10. Apparatus in accordance with claim 9 wherein said base unit includes at least one power supply connected for electrically energizing a power connector located in conjunction with the said base unit connection for engaging the said connector of a said power connector board in a said block.

11. A method of fabricating a rack of equipment modules comprising the steps of:
    forming blocks from parallel panels so as to define channels located on opposite sides thereof with at least one of said channels having a plurality of receiving slots therein;
    retaining a latch element in sliding relation in one of said channels with a plurality of finger segments extending outwardly from said channel;
    constructing a base unit including first and second upwardly facing channels, with a first of said channels having a said plurality of receiving slots and the second of said channels having a said latch element with a said plurality of finger segments slidably retained therein;
    securing one of said blocks to said base unit by inserting its finger segments into said receiving slots and sliding said latch element into a locked position;
    securing a second of said blocks to said base unit by inserting the said latch element of said base unit into the said receiving slots of said second block and sliding said latch element into a locked position; and
    attaching an equipment module between said panels of said first and second blocks.

12. The method in accordance with claim 11 which includes the step of establishing an electrical path through at least one of said blocks and the said equipment module attached thereto.

13. The method in accordance with claim 12 wherein said electrical path establishing step includes the step of coupling said electrical path to an electrical power source.

14. The method in accordance with claim 13 which includes steps of establishing a second electrical path in selected said blocks for supporting electrical signal communication between said blocks and at least one said equipment module attached thereto, and differentiating between said blocks having a said electrical path for coupling to said power source and said blocks having a said electrical path for supporting electrical signal communication.

15. The method in accordance with claim 14 wherein said differentiating step includes the step of arranging mating pins and receptacle holes for allowing mechanical connection only between blocks and base unit connectors having similar ones of said electrical paths.

16. The method in accordance with claim 15 wherein said arranging step includes the step of positioning said mating pins and receptacle holes for facilitating alignment of said blocks relative to one another during attachment.

* * * * *